United States Patent
Hayata et al.

(10) Patent No.: US 7,932,109 B2
(45) Date of Patent: Apr. 26, 2011

(54) ORGANIC ELECTROLUMINESCENT DISPLAY AND MANUFACTURING METHOD THEREFOR

(75) Inventors: Hiroshi Hayata, Osaka (JP); Naoki Suzuki, Osaka (JP); Yoshio Kanata, Nara (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/668,724

(22) PCT Filed: May 25, 2009

(86) PCT No.: PCT/JP2009/002300
§ 371 (c)(1),
(2), (4) Date: Jan. 12, 2010

(87) PCT Pub. No.: WO2009/144912
PCT Pub. Date: Dec. 3, 2009

(65) Prior Publication Data
US 2011/0042691 A1 Feb. 24, 2011

(30) Foreign Application Priority Data
May 29, 2008 (JP) .................. 2008-141291

(51) Int. Cl.
*H01L 21/77* (2006.01)
(52) U.S. Cl. .............. 438/29; 257/E21.598; 427/68
(58) Field of Classification Search ........... 257/E21.598, 257/E33.061; 313/498; 347/106; 427/64, 427/68; 438/22, 29, 34, 35; 445/24
See application file for complete search history.

(56) References Cited

U.S. PATENT DOCUMENTS

| 7,091,660 | B2 | 8/2006 | Park et al. |
| 7,111,755 | B2 | 9/2006 | Koyama et al. |
| 7,503,823 | B2 * | 3/2009 | Hashimoto et al. .......... 445/24 |
| 7,655,270 | B2 | 2/2010 | Nagae et al. |
| 2004/0056915 | A1 | 3/2004 | Miyazawa |
| 2005/0170208 | A1 | 8/2005 | Yatsunami et al. |
| 2006/0097630 | A1 | 5/2006 | Shiokawa et al. |
| 2006/0290764 | A1 | 12/2006 | Nagae et al. |
| 2007/0132356 | A1 | 6/2007 | Hashimoto et al. |

(Continued)

FOREIGN PATENT DOCUMENTS
JP 2003-208979 7/2003
(Continued)

OTHER PUBLICATIONS
English language Abstract of JP 2003-266669, Sep. 24, 2003.
(Continued)

*Primary Examiner* — Matthew S Smith
*Assistant Examiner* — Daniel Shook
(74) *Attorney, Agent, or Firm* — Greenblum & Bernstein, P.L.C.

(57) ABSTRACT

This invention provides a means for suppressing streaks of light emission in an organic EL display having an organic light-emitting layer formed by coating by an ink jet method. A manufacturing process of the organic EL display of this invention includes: preparing a display substrate having two or more linear banks in parallel to each other, and two or more pixel regions arranged in a region between the linear banks; arranging an ink jet head such that the alignment direction of nozzles and the line direction of the linear banks are in parallel; and relatively moving the ink jet head in a direction perpendicular to the line direction of the linear banks and discharging the ink from the nozzles to apply the ink to every region defined by the linear banks.

8 Claims, 18 Drawing Sheets

U.S. PATENT DOCUMENTS

| | | |
|---|---|---|
| 2007/0241665 A1 | 10/2007 | Sakanoue et al. |
| 2007/0290604 A1 | 12/2007 | Sakanoue et al. |
| 2008/0012480 A1 | 1/2008 | Yatsunami et al. |
| 2008/0113282 A1 | 5/2008 | Andoh et al. |
| 2009/0160325 A1 | 6/2009 | Yatsunami et al. |
| 2009/0253331 A1 | 10/2009 | Hashimoto et al. |

FOREIGN PATENT DOCUMENTS

| | | | |
|---|---|---|---|
| JP | 2003-266669 | | 9/2003 |
| JP | 2004-71222 | | 3/2004 |
| JP | 2004-071222 | | 3/2004 |
| JP | 2004-90621 | | 3/2004 |
| JP | 2004-090621 | | 3/2004 |
| JP | 2004-362818 | | 12/2004 |
| JP | 2005-56614 | | 3/2005 |
| JP | 2005-334781 | | 12/2005 |
| JP | 2005334781 A | * | 12/2005 |
| JP | 2007-29946 | | 2/2007 |
| JP | 2007-080545 | | 3/2007 |
| JP | 2007-80545 | | 3/2007 |
| JP | 2007-188862 | | 7/2007 |
| JP | 2008-015309 | | 1/2008 |
| JP | 2008-15309 | | 1/2008 |
| JP | 2008-20517 | | 1/2008 |
| JP | 2008-108570 | | 5/2008 |

OTHER PUBLICATIONS

English language Abstract of JP 2004-362818, Dec. 24, 2004.
English language Abstract of JP 2007-080545, Mar. 26, 2007.
English language Abstract of JP 2008-015309, Jan. 24, 2008.
English language Abstract of JP 2003-208979, Jul. 25, 2003.
English language Abstract of JP 2004-090621, Mar. 25, 2004.
English language Abstract of JP 2004-071222, Mar. 4, 2004.
English language Abstract of JP 2008-108570, May 8, 2008.
International Search Report issued with respect to PCT/JP2009/002300, mailed Sep. 1, 2009.
English language translation of paragraphs [0060]-[0062] JP 2005-56614, which published on Mar. 3, 2005.
English language translation of paragraph [0019] of JP 2008-20517, which published on Jan. 31, 2008.

* cited by examiner

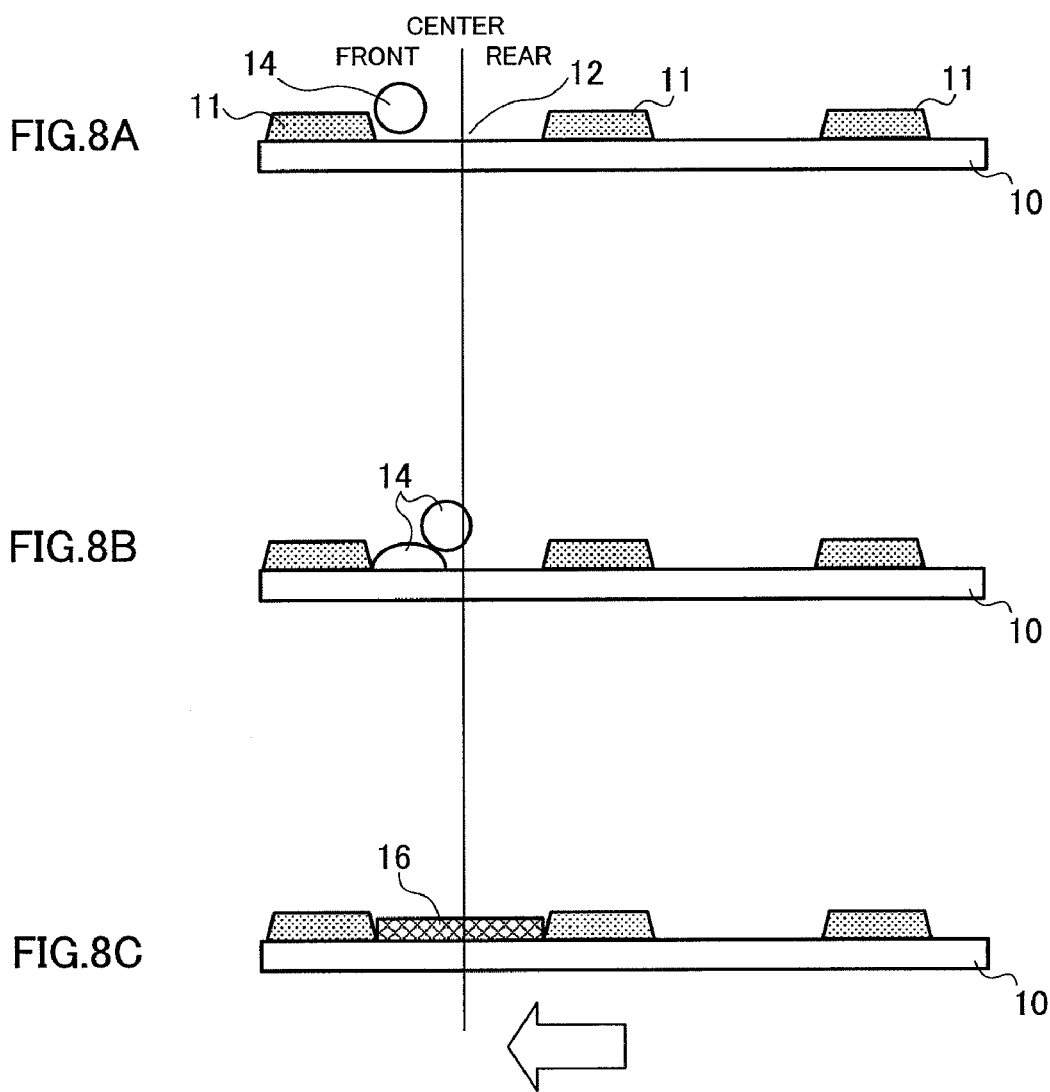

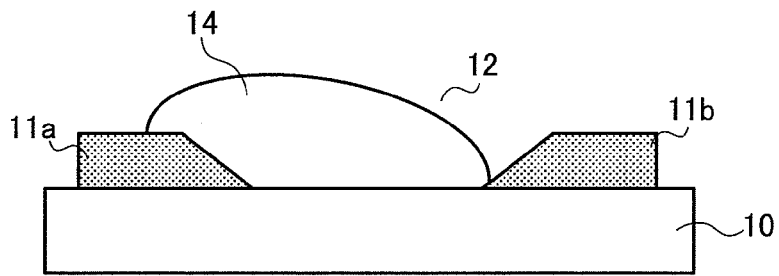
FIG.9A
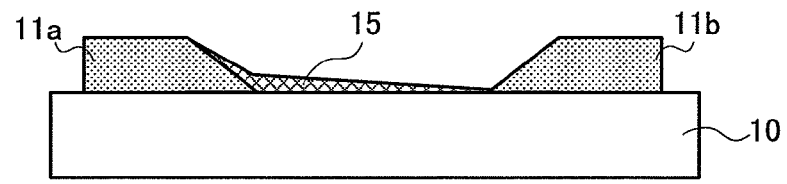
FIG.9B
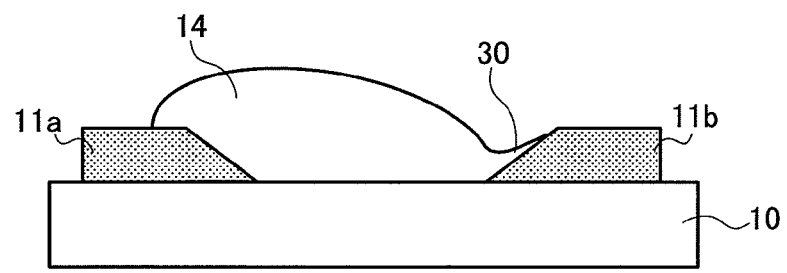
FIG.9C
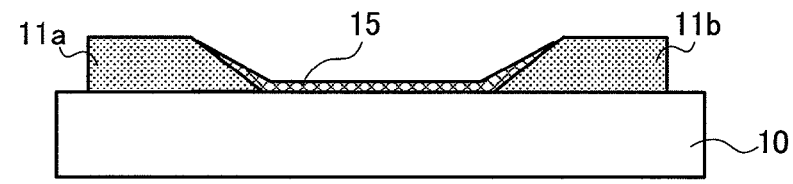
FIG.9D
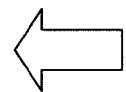

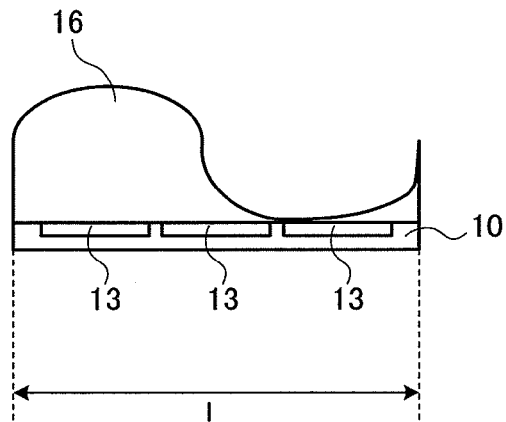
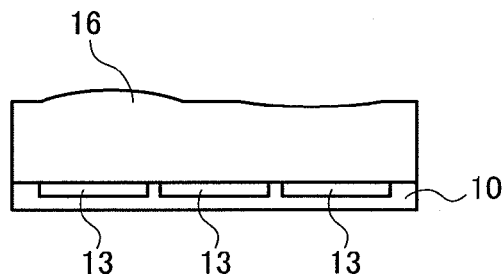
FIG.10A  FIG.10B
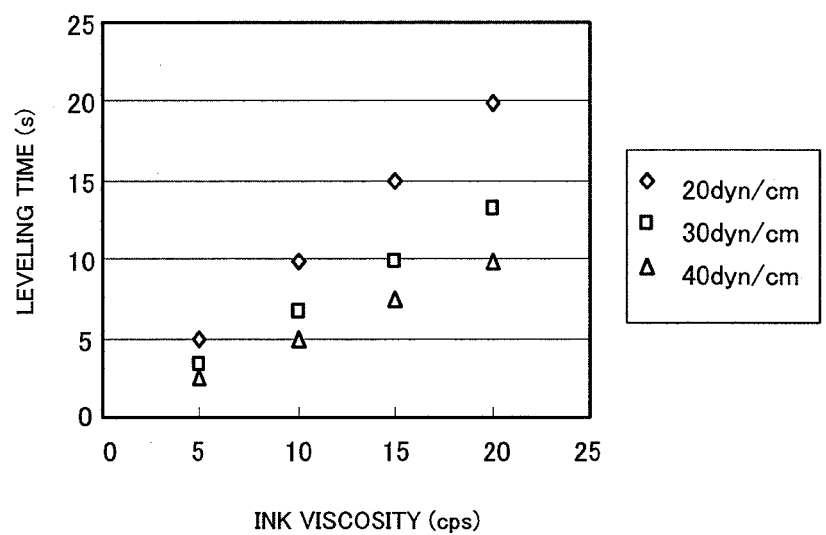
FIG.11

ORGANIC ELECTROLUMINESCENT DISPLAY AND MANUFACTURING METHOD THEREFOR

TECHNICAL FIELD

The present invention relates to a method of manufacturing an organic electroluminescent (EL) display. More particularly, the invention relates to a method of manufacturing an organic EL display in which an organic light-emitting layer is formed by a coating method (more specifically by an ink jet method).

BACKGROUND ART

Organic EL displays can be broadly classified, according to methods with which their organic light-emitting layers are formed, into the following two types. One type employs a method of forming an organic light-emitting layer by deposition, which is used in the case where the organic light-emitting layer is made of a low-molecular-weight organic material. The other type employs a method of forming an organic light-emitting layer by a solvent coating method, which is often used in the case where the organic light-emitting layer is made of a polymeric organic material as well as a low-molecular-weight organic material.

As one of representative measures for forming an organic light-emitting layer by a solvent coating method, there is a method of discharging droplets of ink containing an organic light-emitting material into pixel regions of a display substrate using an ink jet device to form an organic light-emitting layer (see Patent Document 1). In the discharged droplet, an organic light-emitting material and a solvent are included.

The ink jet device includes an ink jet head having two or more nozzles. While controlling a positional relationship between the nozzles of the ink jet head and the display substrate, the ink jet device discharges ink from the nozzles. It is known that there are variations in size among droplets discharged from nozzles that the ink jet head has (see Patent Document 2). Reported in Patent Document 2 is a technique of causing a plurality of droplets to land on one pixel region and adjusting the landing position of each droplet, thereby improving film uniformity in the pixel region.

On the other hand, a pixel region of a display substrate into which droplets are discharged is often defined by a partition, referred to as a "bank". This is for the purpose of causing discharged ink to position-selectively remain in the pixel region. A plurality of pixels are arranged on the substrate in rows of respective colors (R, G or B) such that they form a stripe pattern. As one of methods of discharging droplets onto a display substrate having banks that partition pixels, a method of discharging droplets while causing an ink jet head of an ink jet device to scan in a direction perpendicular to the longitudinal direction of the stripe is known (see Patent Documents 4 to 6).

Further, as another of the methods of discharging droplets onto a display substrate having banks that each partition pixels, a method of combining an ink jet head of an ink jet device that scans in a direction perpendicular to the longitudinal direction of the stripe and an ink jet head of the ink jet device that scans in the longitudinal direction of the stripe so as to apply droplets is known (see Patent Document 7).

On the other hand, banks may define a linear region including a group of pixels of the same color (for example, R: red, G: green, or B: blue) arranged in a row, among pixels arranged in the form of stripes (see Patent Document 3). The bank that defines the linear region may be referred to as a "linear bank". That is, an organic light-emitting layer of R, G or B is formed in every region (hereinafter also referred to as a "linear region") defined by the linear bank.

PRIOR ART REFERENCES

Patent Document 1: Japanese Patent Application Laid-Open No. 2004-362818
Patent Document 2: Japanese Patent Application Laid-Open No. 2003-266669
Patent Document 3: U.S. Pat. No. 7,091,660
Patent Document 4: Japanese Patent Application Laid-Open No. 2008-15309
Patent Document 5: U.S. Patent Application Publication No. 2008/0113282
Patent Document 6: Japanese Patent Application Laid-Open No. 2008-108570
Patent Document 7: Japanese Patent Application Laid-Open No. 2007-80545

DISCLOSURE OF INVENTION

Problems to be Solved by the Invention

In the case of forming an organic light-emitting layer on a display substrate having linear banks formed thereon using an ink jet device, as shown in FIG. 1, 1) ink jet head 120 of the ink jet device is arranged in an upper portion (or a lower portion) with respect to a line direction of linear banks 111 of display substrate 100 (at this point, preferably, the arrangement is made so that the line direction of linear banks 111 and an alignment direction of nozzles 121 are perpendicular to each other), 2) while ink jet head 120 is relatively moved in parallel to the line direction of linear banks 111 (that is, while transporting substrate 100 in the direction shown by an arrow), 3) droplets are discharged from nozzles 121 into linear region 110 defined by linear banks 111 to form an organic light-emitting layer.

In this way, the relative movement of the ink jet head in parallel to the line direction of the linear banks prevents ink to be applied into one linear region from erroneously intruding into the adjacent linear region. That is, in a color display, for example, a linear region in which an R organic light-emitting layer is formed, a linear region in which a G organic light-emitting layer is formed, and a linear region in which a B organic light-emitting layer is formed are repeatedly arranged, so that a stripe pattern is formed. Therefore, ink containing an organic light-emitting material must be reliably prevented from leaking into the adjacent linear region to cause color mixture. For this purpose, ink is discharged while an ink jet head is relatively moved in parallel to the line direction of the linear banks.

In this case, droplets are always discharged from the same nozzles into one linear region defined by linear banks. That is, for every region defined by linear banks, its corresponding nozzles that supply (discharge) droplets into the region is set.

As described above, it is difficult to set the sizes of all nozzles that an ink jet head has to be strictly fixed. Typically, it is said that the dimension error resulting from machining of a nozzle is about ±5%. Therefore, according to the foregoing method, the amount of supplied ink slightly differs from one region defined by linear banks to another. The difference in amount of supplied ink causes formed organic light-emitting layers to have different thicknesses; the difference in thickness among organic light-emitting layers leads to differences in amount of emitted light, intensity of emitted light and wavelength of emitted light. When the amount of emitted light, the intensity of emitted light, and the wavelength of emitted light differ from one region defined by linear banks to another as mentioned above, it has been found that a person visually recognizes the differences as a streak when a display is driven.

An object of the invention is to suppress non-uniformity in thickness of an organic light-emitting layer from one line to another even when an organic light-emitting layer is formed on a display substrate having linear banks by applying ink onto the substrate using ink jetting with an ink jet head having non-uniformity of nozzles. This allows an organic EL display having high image quality without streaks to be manufactured. Further, an object of a preferred aspect of the invention is to provide a method of manufacturing a high definition organic EL display in which color mixture is suppressed.

Means for Solving the Problems

That is, a first aspect of the invention relates to a method of manufacturing an organic EL display as follows.

[1] A method of manufacturing an organic EL display, comprising:
preparing a display substrate having a substrate, two or more linear banks arranged on the substrate and being in parallel to each other, and two or more pixel regions arranged in linear regions defined by the linear banks;
arranging an ink jet head which has two or more nozzles aligned in a row at a given pitch and to which ink containing an organic light-emitting material is supplied, to a side with respect to a line direction of the linear banks; and
relatively moving the ink jet head in a direction perpendicular to the line direction of the linear banks and discharging the ink from the nozzles to apply the ink to every linear region defined by the linear banks.

[2] The manufacturing method as described in [1], further comprising waiting until the ink applied to the linear regions defined by the linear banks becomes uniform and then drying a solvent contained in the ink.

[3] The manufacturing method as described in [1], wherein a distance from a nozzle at one end to a nozzle at another end, among the nozzles arranged in the ink jet head, is equal to or greater than a length in the line direction of the linear regions of the substrate.

[4] The manufacturing method as described in [1], wherein a speed of relatively moving the ink jet head in the direction perpendicular to the line direction of the linear banks is inconstant; and
the speed of relatively moving while the ink is discharged from the nozzles to the linear region defined by the linear banks is lower than the speed of relatively moving while the ink is not discharged.

[5] The manufacturing method according to claim 1, wherein the ink discharged from the nozzles lands on a forward side in the linear regions defined by the linear banks, with respect to a relative moving direction of the display substrate to the ink jet head.

[6] The manufacturing method according to claim 1, wherein:
as to a set of the linear banks defining one of the linear regions, a linear region side of one linear bank has lower wettability than a linear region side of the other linear bank, the one linear bank being forward in the relative moving direction of the display substrate with respect to the inkjet head, the other linear bank being rear in the relative moving direction of the display substrate with respect to the inkjet head.

A second aspect of the invention relates to an organic EL display as follows.

[7] An organic EL display, comprising:
a substrate;
a plurality of linear banks arranged on the substrate and being in parallel to each other;
two or more pixel regions arranged in a linear region defined by the linear banks; and
a linear organic light-emitting layer arranged in the linear region including the pixel regions,
wherein contacts between the linear organic light-emitting layer and the linear banks have a fixed height in a line direction.

[8] The manufacturing method according to claim 1, wherein:
the linear region includes at least a first linear region and a second linear region, the first linear region provided at one end of the substrate, the second linear region provided at an opposite end of the substrate, wherein
a contact between the linear organic light-emitting layer arranged in the first linear region and the linear bank at the one end side of the substrate is lower in height than a contact between the linear organic light-emitting layer arranged in the second linear region and the linear bank at the opposite end side of the substrate.

Advantageous Effects of Invention

According to a method of the invention, although organic light-emitting layers are formed on a display substrate having linear banks by an ink jet method, variations in thickness of the organic light-emitting layer from one linear region to another can be suppressed. An organic EL display without luminance unevenness is therefore obtained. Further, according to a preferred method of the invention, a high definition organic EL display in which color mixture is suppressed is obtained.

BRIEF DESCRIPTION OF DRAWINGS

FIG. 8 shows a state of adjusting landing positions of ink droplets to prevent color mixture;

FIG. 9 shows a state of obtaining uniformity of a coated film utilizing surface tension of ink with respect to a bank;

FIG. 10 illustrates a simulation of leveling of ink discharged into linear regions;

FIG. 11 is a graph showing a relationship among surface tension of ink with respect to a linear region (coating region), ink viscosity, and time until a coated film is leveled: where symbol ◇ is a plot in the case where surface tension of the coated film is 20 dyn/cm; symbol □ is a plot in the case where surface tension of the coated film is 30 dyn/cm; and symbol Δ is a plot in the case where surface tension of the coated film is 40 dyn/cm;

BEST MODE FOR CARRYING OUT THE INVENTION

An organic EL display manufactured by the invention has two or more linear banks arranged in parallel to each other. The linear bank may be forward tapered or reverse tapered, and preferably forward tapered. The material for a first bank may be any material as long as it has insulating properties; however it is preferable that the material be an insulating resin (such as polyimide). The surface of the linear bank may be subjected to a fluoridation process using fluorine gas plasma or the like to reduce its wettability.

The line direction of the linear bank may be any direction. Typically, the linear bank is in parallel to the short axis direction of a display or in parallel to its long axis direction.

Figure 2A:
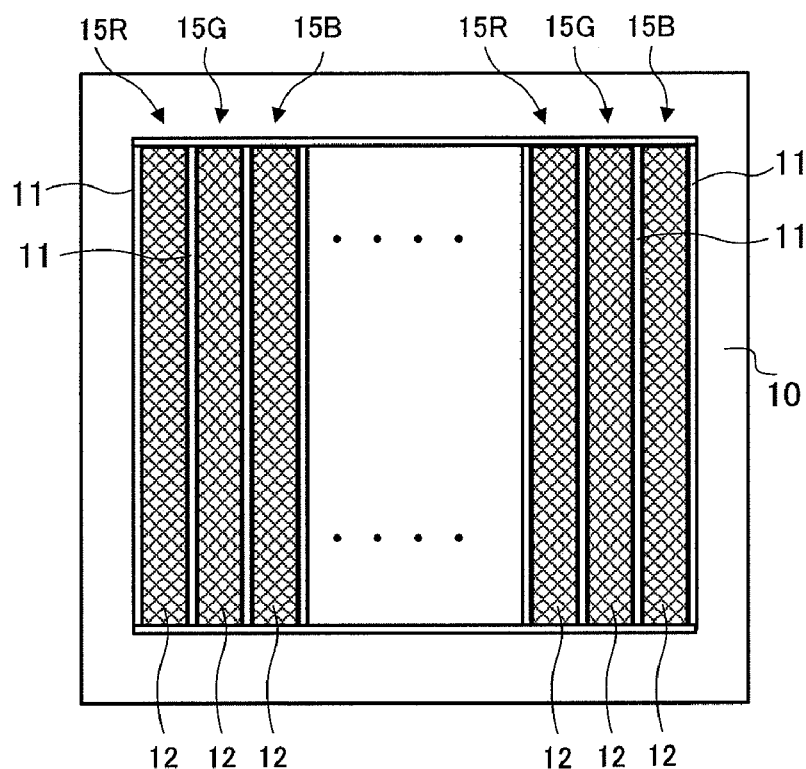
FIG. 2A shows an arrangement state of organic light-emitting layers.

An organic light-emitting layer is arranged in a line shape in a region (linear region) sandwiched between linear banks adjacent to each other. FIG. 2A shows a state of an organic EL display in which a cathode electrode and the like are omitted to expose organic light-emitting layers. As shown in FIG. 2A, R organic light-emitting layer 15R, G organic light-emitting layer 15G or B organic light-emitting layer 15B is formed in each linear region 12, and they are repeatedly arranged (forming a stripe pattern). It is preferable that the thickness of an organic light-emitting layer be from about 50 to 100 nm (for example, 60 nm).

Figure 2B:
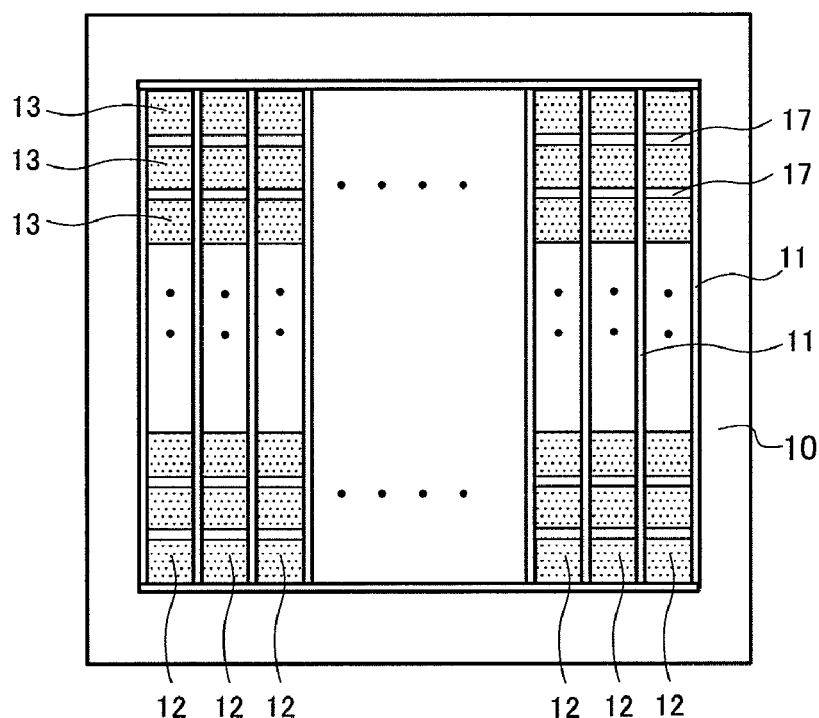
FIG. 2B shows an arrangement state of linear banks and pixel regions.

FIG. 2B shows a state in which organic light-emitting layers 15R, 15G, and 15B are omitted to expose pixel region 13. As shown in FIG. 2B, two or more pixel regions 13 are arranged in rows in linear region 12. Pixel regions 13 are not independently partitioned so that a liquid in the each pixel is not interfere with movement to adjacent pixel. Pixel regions 13 are linked to one another so that the liquid can move among them through gaps 17. In other words, ink discharged into linear region 12 can freely move in linear region 12.

In each pixel region 13, at least a pixel electrode (typically an anode electrode) is arranged. In the case of employing an active type, an anode electrode is independently arranged in every pixel region while in the case of employing a passive type, anode electrodes are arranged in a stripe pattern. In the case of employing bottom emission, an anode electrode needs to be a transparent electrode, and may be an indium-tin-oxide (ITO) electrode or the like. In the case of employing top emission, an anode electrode is preferably a reflecting electrode, and may be a silver electrode, a silver-palladium-copper alloy (also referred to as "APC") electrode or the like. In the case of employing an active type, an anode electrode is connected to a drain electrode of a thin film transistor (TFT).

A hole transport layer and an electron blocking layer may be arranged on and above the anode electrode. The hole transport layer is a layer made of a hole transfer material. The materials for the hole transport layer may be oxide such as $WO_x$ (tungsten oxide), $MoO_x$ (molybdenum oxide) or $VO_x$ (vanadium oxide), or a combination of these materials. The hole transfer material may be poly(3,4-ethylenedioxythiophene) doped with polyethylene sulfonate (referred to as "PEDOT-PSS"), or its derivative (such as copolymer). The thickness of a hole transport layer is typically 10 nm or more and 100 nm or less, and can be about 30 nm.

The electron blocking layer has a role that blocks electrons from being transported to the hole transport layer and a role that transports holes to an organic light-emitting layer with efficiency, and is made of, for example, a polyaniline material. The thickness of an electron blocking layer is typically 10 nm or more and 100 nm or less, and can be about 40 nm.

As such, the organic light-emitting layer is arranged over the whole linear region including two or more pixel regions aligned in a row. That is, the organic light-emitting layer extends over two or more pixel regions aligned in a row.

A method of manufacturing an organic EL display panel according to the invention includes 1) preparing a display substrate before organic light-emitting layers are formed (see FIG. 2B), 2) arranging an ink jet head beside the prepared display substrate, and 3) applying ink containing an organic light-emitting material by ink jetting to form an organic light-emitting layer.

The display substrate before forming organic light-emitting layers is, for example, the substrate shown in FIG. 2B, and includes a substrate, a plurality of linear banks in parallel to each other, and a plurality of pixel regions arranged in linear regions sandwiched between the linear banks. In pixel regions 13 at this point, for example, anode electrodes are exposed, hole injection transport layers are exposed, or electron blocking layers are exposed.

In the ink jet head arranged beside the substrate, a plurality of nozzles are arranged in a row. Ink containing an organic light-emitting material is supplied to the head, and the ink is discharged as droplets from the nozzles.

The organic light-emitting material contained in ink is preferably a polymeric luminescent material, and examples of the polymeric luminescent material include poly phenylene vinylene (PPV) and its derivatives, poly acetylene and its derivatives, polyphenylene and its derivatives, poly para phenyleneethylene and its derivatives, poly 3-hexyl thiophene (P3HT) and its derivatives, poly fluorene (PF) and its derivatives, and the like.

The ink jet head is arranged beside the substrate. Specifically, the ink jet head is arranged in a side with respect to the line direction of the linear banks, and more specifically in a side with respect to the line direction of a linear bank at the farthest end among a plurality of linear banks. The alignment direction of nozzles of the arranged ink jet may be in parallel to the line direction of linear banks of the substrate (see FIG. 3).

Figure 3A:
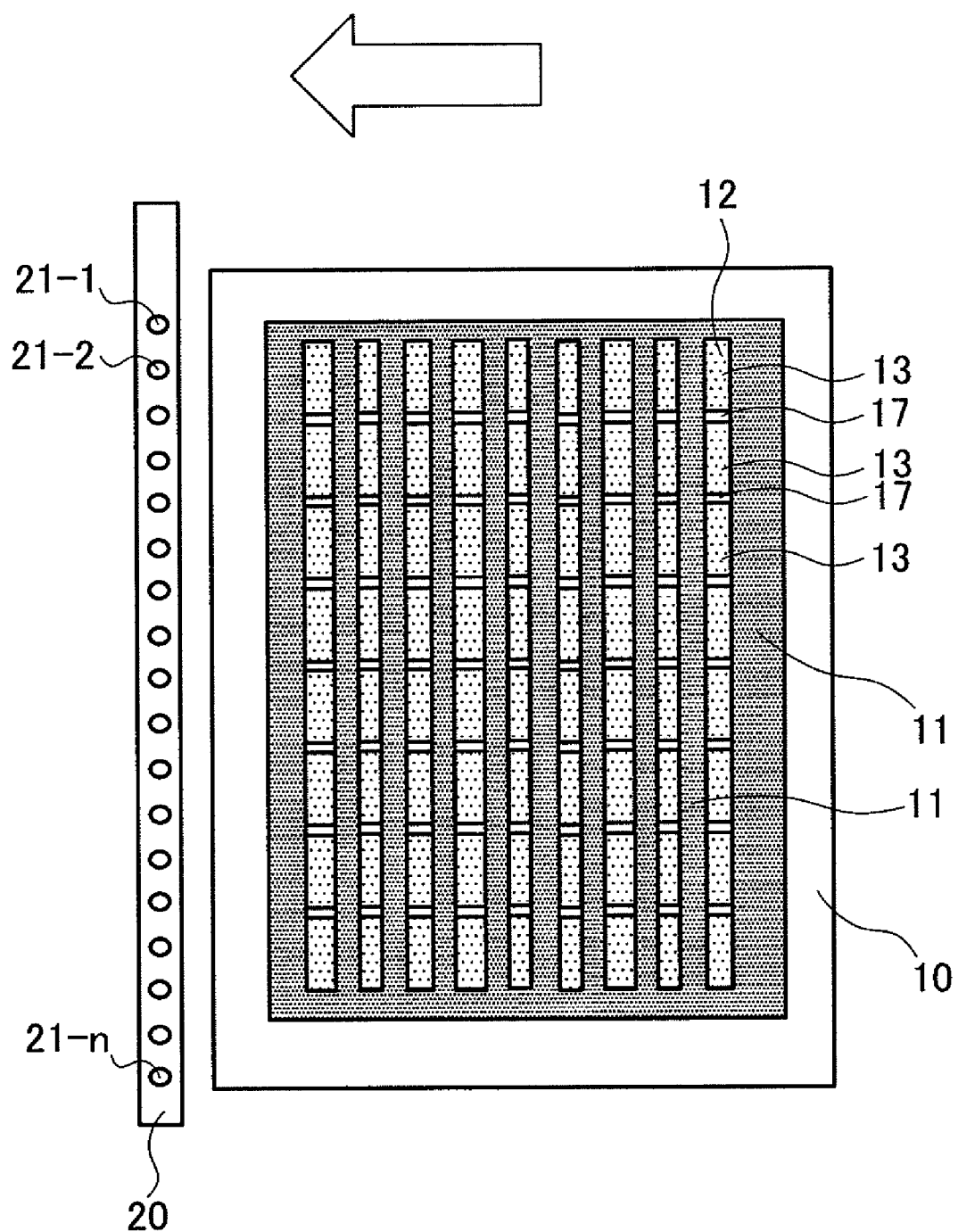
FIG. 3A shows a state of forming an organic light-emitting layer in a line shape by coating with an ink jet method in the invention.

As shown in FIG. 3A, it is preferable that among nozzles 21 (21-1 to 21-$n$) arranged in ink jet head 20, a distance from nozzle 21-1 at one end to nozzle 21-$n$ at the other end be equal to or greater than the length in the line direction of linear region 12 of substrate 10. This is because ink can be applied over the whole linear region 12 at a time. When the alignment direction of nozzles 21 of ink jet head 20 is inclined with respect to the line direction of linear region 12, it is preferable that "the component in the foregoing line direction of the distance from nozzles 21-1 to nozzle 21-$n$" be equal to or greater than the length in the line direction of linear region 12.

Figure 3B:
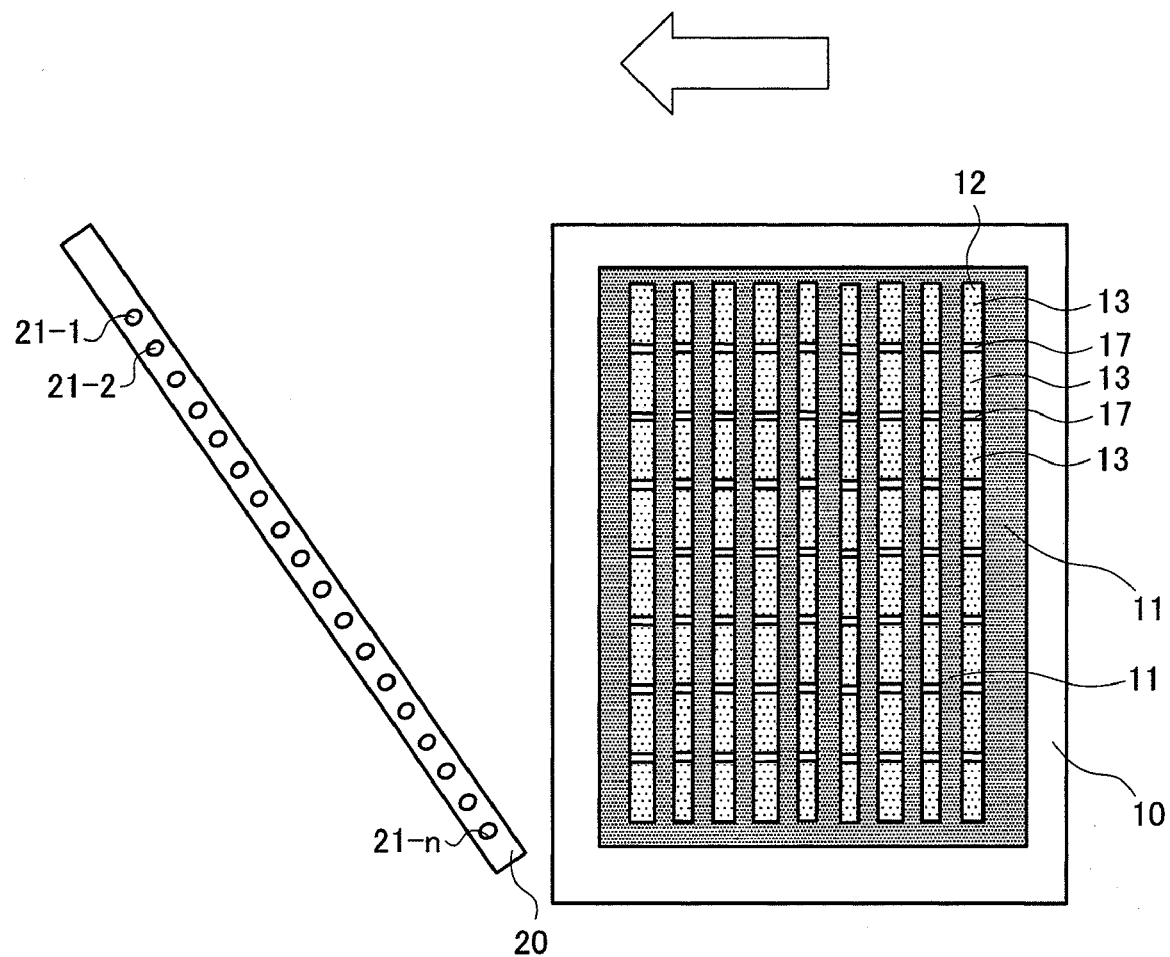
FIG. 3B shows a state of forming an organic light-emitting layer in a line shape by coating with an ink jet method of the invention.
Figure 3C:
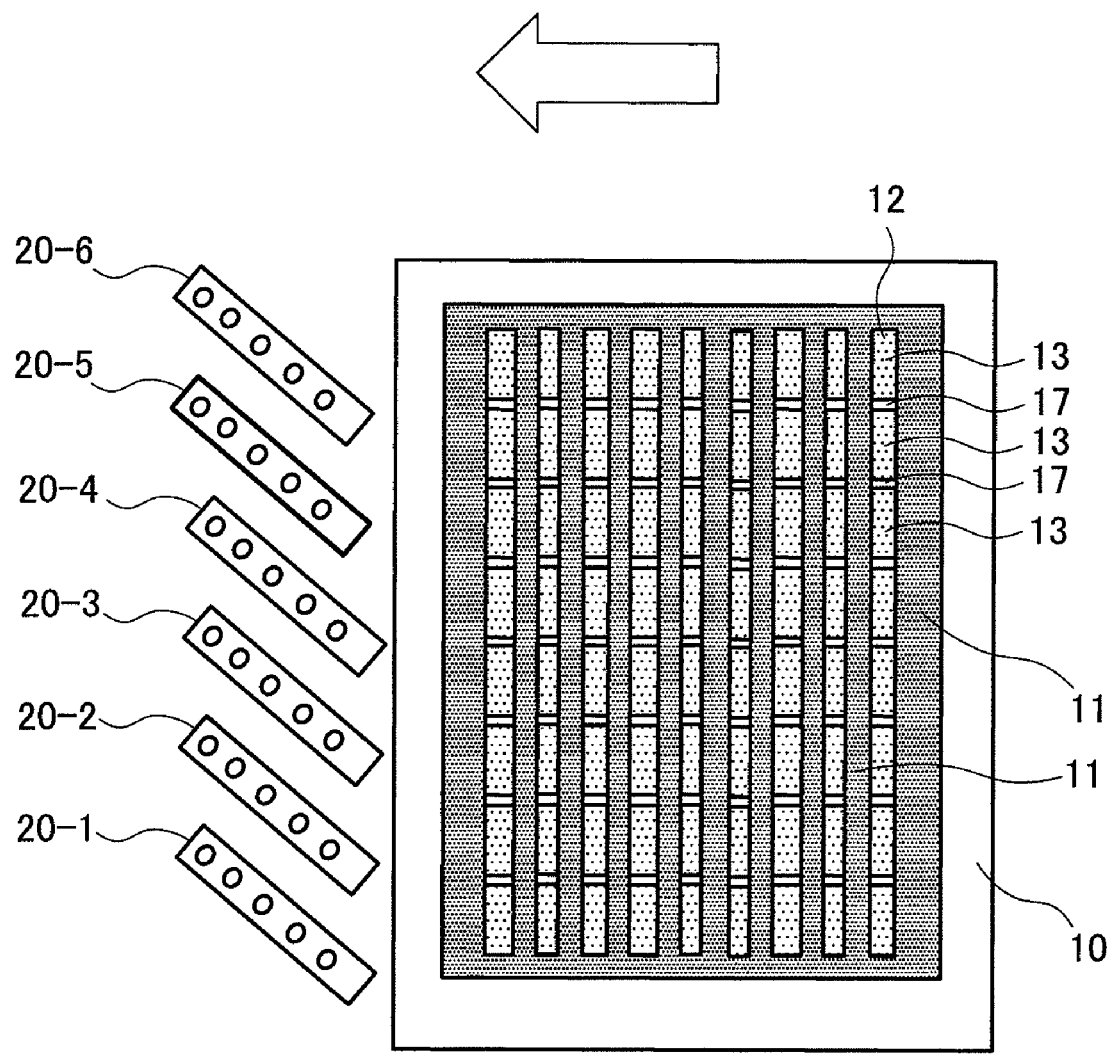
FIG. 3C shows a state of forming an organic light-emitting layer in a line shape by coating with an ink jet method of the invention.

As shown in FIG. 3B, ink jet head 20 may be arranged so as to be inclined with respect to the line direction. This can decrease the pitch of droplet landing in one linear region, enabling the time required for leveling to be reduced. However, the inclining of ink jet head 20 causes time differences in landing of droplets on the same linear region. Therefore, an ink droplet that has first landed on a region dries and increases its viscosity until the final ink droplet lands on the region, which interferes with leveling after droplets are connected. To solve this drawback, as shown in FIG. 3C, a plurality of ink jet heads (20-1 to 20-6) may be arranged so as to be each inclined with respect to the line direction. This enables reduction of the time differences in droplet landing to shorten the time required for connecting droplets over the whole linear region. The leveling in the linear region can therefore be ensured. If a plurality of ink jet heads are overlapped, the time required for connecting droplets over the whole linear region can further be shortened.

Applying ink in this way allows ink discharged from all nozzles to be leveled in the linear region even if there are variations in discharge caused by size variations among nozzles. Variations in applied film thickness can therefore be suppressed. However, it is not necessarily required for ink amount corresponding to the desired film thickness to be applied in a single scan. The applying of ink to the whole linear region 12 may be completed by repeating scanning a plurality of times. If ink is applied by repeating scanning a plurality of times, however, the viscosity of the ink applied in the former scanning may increase to suppress leveling in its connection portion with ink applied in the latter scanning. Therefore, in the case of using a solvent that easily evaporates, such as ink solvent of an organic light-emitting material, it is desirable that ink be applied over the whole linear region in a single scan.

It is preferable that the pitch between nozzles 21 arranged in a row in ink jet head 20 be from 10 to 50 µm, and be, for example, about 20 µm. This is for the purpose of causing ink discharged from nozzles 21 to be mutually connected at the point on which the ink lands. It is also preferable that the amount of ink per droplet of the droplets discharged from nozzles 21 be from 1 to 15 pl, and be, for example, 3 pl.

It is preferable that droplets land also on gap 17 between the pixel regions shown in FIG. 2B. The landing of droplets on gap 17 makes it possible to connect ink of the pixel regions to level them with reliability, even though wettability of pixel regions 12 differ from that of gap 17 between the pixel regions. It is also preferable that an electron blocking layer be provided in the whole linear region before a light-emitting layer is applied to make the wettability of pixel regions 12 equal to the wettability of gap 17 between the pixel regions. As a result, ink of the pixel regions can be connected with reliability to improve leveling.

It is preferable that the height of gap 17 between the pixel regions be greater to some extent than the height of pixel regions 13. However, the difference in height is set so as not to be too large, and the applied film immediately after the applying of ink covers gap 17 so as to avoid interfering with leveling. Thus, while achieving leveling, ink is concentrated into pixel region 13 in a drying process to effectively use an ink material.

Next, ink jet head 20 is moved relatively with respect to display substrate 10 in a direction perpendicular to the line direction of linear banks 11 of display substrate 10. Ink jet head 20 may be moved, or substrate 10 may be transported, or both of them may be moved. When, as a result of the relative movement of ink jet head 20, nozzles 21 of ink jet head 20 reach one of linear regions 12 (see FIG. 4), droplets of ink are discharged from nozzles 21.

The amount of applied ink is from 100 to 500 pl per pixel. A plurality of droplets may be discharged from one nozzle into one pixel, thereby supplying the required amount of ink.

The discharged droplets of ink land on linear region 12. As mentioned above, there are two or more pixel regions 13 in linear region 12, and droplets that have landed on one pixel region can move (wet and spread) to the adjacent pixel region. Since droplets can move between pixel regions, the thickness of the whole applied film formed in linear region 12 is made uniform (see FIG. 10).

That is, as mentioned above, the amount of droplets discharged from nozzles 21 of ink jet head 20 may differ from one nozzle to another. According to the invention, the thickness of the applied film is made uniform (leveled) in linear region 12. Therefore, even though there is a difference among the amounts of droplets from nozzles 21, the applied film in linear region 12 is made uniform.

Figure 5:
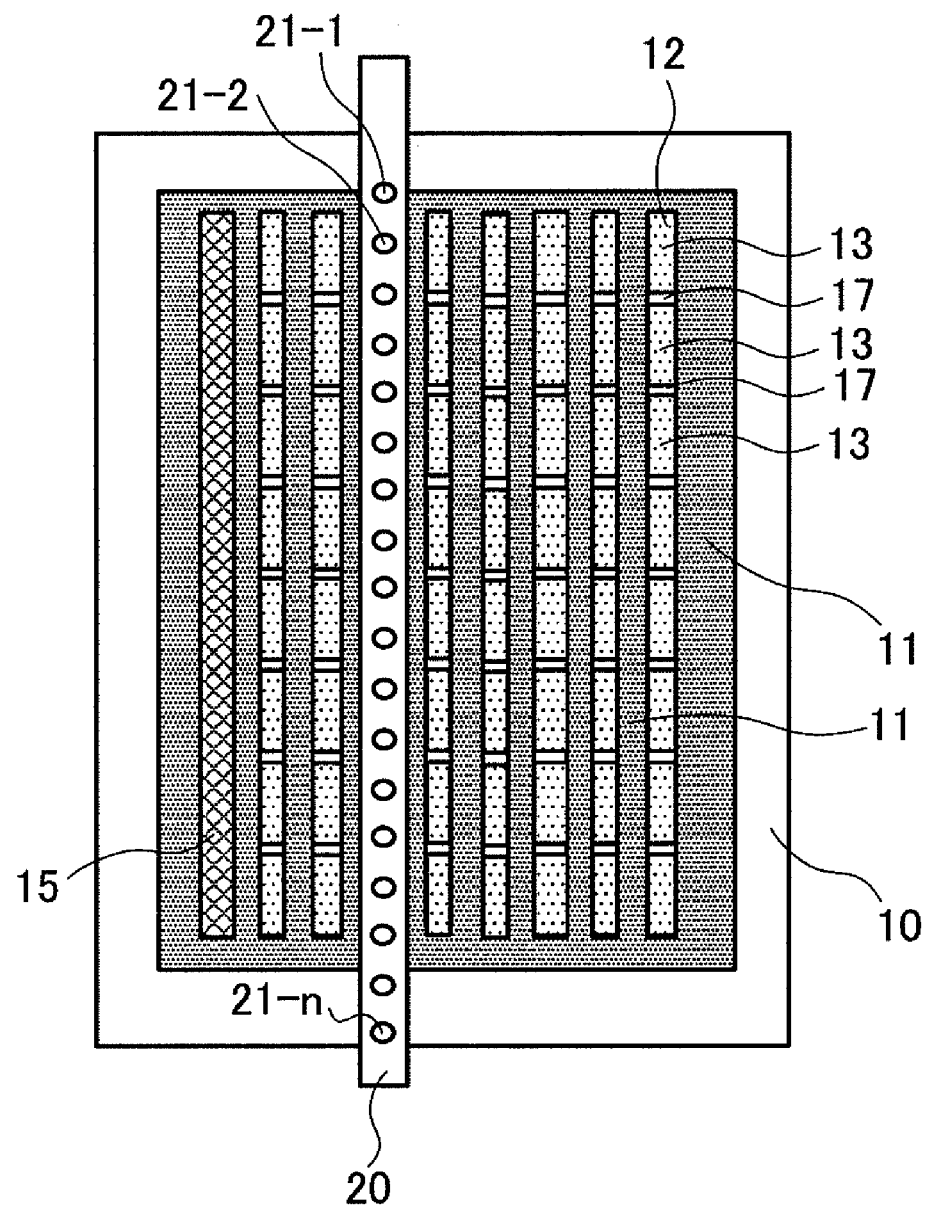
FIG. 5 shows a state of forming an organic light-emitting layer in a line shape by coating with an ink jet method of the invention.
Figure 6:
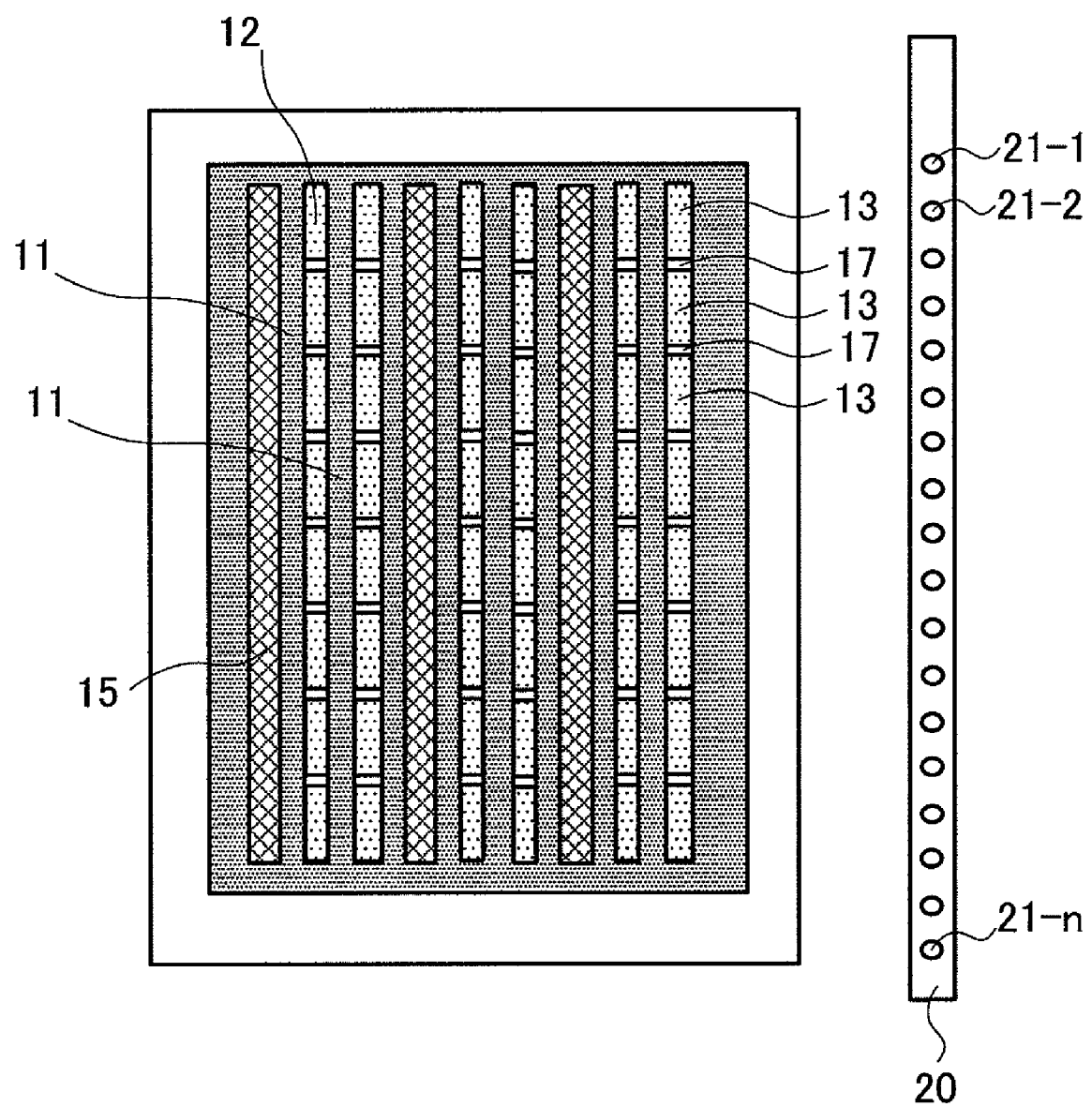
FIG. 6 shows a state of forming an organic light-emitting layer in a line shape by coating with an ink jet method in the invention.

Upon completion of discharging of droplets of ink into one linear region 12, ink jet head 20 is further relatively moved so as to move nozzles 21 of ink jet head 20 to next linear region 12 into which droplets of ink are to be discharged (see FIG. 5). Typically, R ink, G ink and B ink are applied by their respective individual scans, and therefore droplets of ink are discharged into every three linear regions. When nozzles 21 reach desired linear region 12, droplets of ink are discharged again to cause the droplets to land on linear region 12. This is repeated to apply ink to all linear regions 12 into which the ink is to be applied (see FIG. 6).

Since ink is supplied into every linear region 12 in succession in this way, all the linear regions are coated by discharging from the same nozzles. The same amount of ink can therefore be supplied to all linear regions 12. In other words, variations in thickness of the applied film from one linear region to another are reduced. Consequently, streaks can be prevented from occurring when the regions constitute a display.

Further, the other color ink is applied in the same way as mentioned above, so that ink of all of R, G and B is applied.

As described above, the line direction of the linear banks of an organic EL display according to the invention may be in parallel to the short axis direction of the display, or may also be in parallel to the long axis direction. If the line direction of the linear banks is in parallel to the short axis direction, an ink jet head for scanning can be made in a smaller size. In the case where light emission unevenness slightly occurs because of variations in nozzles, the light emission unevenness occurs in a small region and therefore is not conspicuous. On the other hand, if the line direction of the linear banks is in parallel to the long axis direction, the scanning distance of an ink jet head is shortened. This enables coating to be completed in a short time to improve productivity, and also enables drying unevenness during coating to be suppressed.

Color Mixture Prevention

Figure 7:
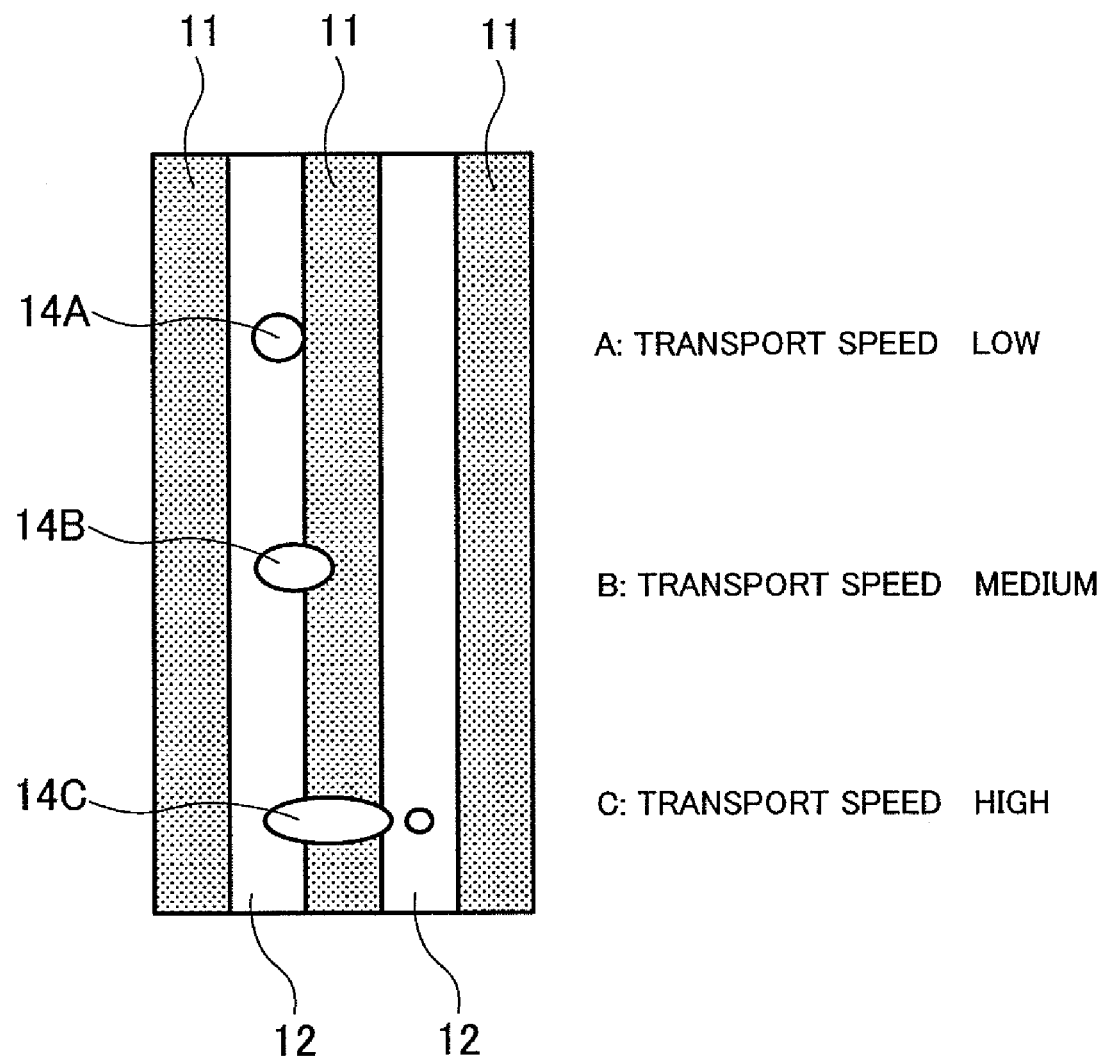
FIG. 7 illustrates that the states of landing ink droplets vary depending on substrate transport speeds.

If ink is supplied into every linear region 12 in succession as described above, a risk of erroneously mixing ink into the adjacent linear region increases, while variations in thickness of the applied film from one linear region to another are reduced. The mixture of ink into the adjacent linear region causes color mixture, remarkably reducing the image quality as a display. In particular, if the speed of relative movement of the ink jet head and the substrate is increased in order to increase productivity, the occurrence rate of color mixture increases. That is, as shown in FIG. 7A, when the speed of relative movement is low, a droplet lands within desired linear region 12 with more reliability while, as shown in FIGS. 7B and 7C, as the relative movement speed increases, the area for landing of a droplet expands in the direction of the movement, and it may be difficult for a droplet to land within desired linear region 12 (see FIG. 7C).

To prevent color mixture as mentioned above, it can be considered to change the relative movement speed (e.g., the transport speed of the substrate) depending on whether ink is discharged from nozzles or not. In other words, when the position of nozzles corresponds to the linear region, the relative movement speed is decreased so as to cause droplets discharged from nozzles to land on the linear region with reliability. On the other hand, during movement of the nozzles from the linear region into which ink has been applied to the next linear region, it is preferable that the relative movement speed be increased to increase productivity. The relative movement speed (preferably the transport speed of the substrate) when droplets are discharged is preferably from 50 to 300 mm/s, while the relative movement speed (preferably the transport speed of the substrate) when droplets are not discharged is not particularly limited, and is, for example, 400 mm/s or more.

To prevent color mixture as mentioned above, as shown in FIGS. 8A and 8B, ink droplet 14 may be landed on the forward side in the transport direction of the substrate (on the rear side in the movement direction of the ink jet head) in linear region 12. The ink unevenly distributed in the forward in the transport direction of the substrate naturally spreads toward the rear in the transport direction by wind pressure caused by transport of the substrate, thereby enabling formation of applied film 16 (FIG. 8C). The substrate itself may optionally be tilted so as to raise the forward in the transport direction of the substrate after the ink application.

Further, as shown in FIG. 9, the surface tension (wettability) of linear bank 11 may be utilized. In FIG. 9A, the wettability of the surface on the side of region 12 of linear bank 11a is equal to the wettability of the surface on the side of region 12 of linear bank 11b. The linear bank 11a is forward in the transport direction (see arrow) of substrate 10, and the linear bank 11b is rear in the transport direction of substrate 10. As shown in FIG. 9A, an ink droplet that has landed in the forward in the transport direction of the substrate does not spread evenly, and therefore the thickness of organic light-emitting layer 15 is unlikely to become uniform, as shown in FIG. 9B.

On the other hand, in FIG. 9C, linear banks 11 define linear region 12, and the wettability of surface 30 on the side of region 12 of linear bank 11b is higher than the wettability of the surface on the side of region 12 of linear bank 11a. The linear bank 11b is rear in the transport direction of the substrate, and the linear bank 11a is forward in the transport direction of the substrate. As shown inn FIG. 9C, ink can wet and spread over the whole linear region 12 even though an ink droplet lands in the forward in the transport direction of the substrate. As a result, organic light-emitting layer 15 having a uniform film thickness is obtained as shown in FIG. 9D.

It is preferable that a manufacturing method according to the invention be carried out in this way by combining measures for reliably preventing color mixture.

Waiting

It is preferable that after ink is discharged to a linear region (including a plurality of pixel regions), it be waited until the thickness of an applied film of the ink is made uniform (leveled), and then a solvent of the ink be removed. Specifically, waiting refers to that the substrate is left in the atmosphere or in an inert gas atmosphere.

The time for waiting varies mainly depending on the viscosity of ink and the surface tension of the ink with respect to a region to which the ink is applied. The viscosity of ink containing an organic light-emitting material to be applied by an ink jet device is from about 5 to 20 cps. The surface tension of ink with respect to a region to which the ink is applied is from 20 to 40 dyn/cm. Hereinbelow, results of the time until the applied film is made uniform obtained by a simulation using the theory of Orchard are shown.

Three pixel regions 13 arranged in the region (linear region) defined by the linear banks are assumed (see FIG. 10). A length 1 in FIG. 10 is about 1 mm. The state in which applied film 16 having ±100% variations is formed in this region is set as the initial state (FIG. 10A). The time from the initial state to a state in which variations of the applied film is leveled to ±1% (FIG. 10B) is obtained. The result is shown in a graph of FIG. 11.

The vertical axis of the graph in FIG. 11 indicates time (sec) required for leveling; and the horizontal axis indicates the viscosity (cps) of ink constituting an applied film. Plots of ◇ represent results in the case where the surface tension of the applied region is 20 dyn/cm; plots of □ represent results in the case where the surface tension of the applied region is 30 dyn/cm; and plots of Δ represent results in the case where the surface tension of the coated region is 40 dyn/cm.

As shown in the graph of FIG. 11, it is found that leveling is completed in 5 to 20 seconds in any case. Accordingly, it is found that the thickness of the coated film becomes uniform after waiting for 5 to 20 seconds after applying of ink.

As a matter of course, the waiting time may be affected by evaporation of a solvent from the applied film, and therefore is adjusted in accordance with the actual conditions.

After waiting, with the whole display substrate placed in the high-temperature environment or in the reduced-pressure environment, the solvent is removed from a leveled applied film (drying process). Thereby, an organic light-emitting layer is formed. In this way, an organic light-emitting layer having a highly uniform thickness is formed in each linear region, and variations in thickness of the organic light-emitting layer among linear regions are reduced.

After the organic light-emitting layers are formed, an electron injection transport layer, an opposite electrode (typically a cathode electrode) and the like are layered to produce an organic EL device, and further a sealing film, a glass substrate and the like are arranged, thereby manufacturing a display.

The material of a cathode electrode layer differs depending on whether the display is a bottom emission type or a top emission type. In the case of the top emission type, the cathode electrode needs to be transparent, and therefore it is preferable that an ITO electrode, an indium zinc oxide (IZO) electrode or the like be formed. It is preferable that a buffer layer and the like be formed between the organic light-emitting layer and the cathode electrode layer. On the other hand, in the case of the bottom emission type, the cathode electrode need not be transparent, and an electrode made of any material may be used.

The cathode electrode may be formed on the organic light-emitting layer arranged in each pixel region, and is sometimes formed so as to cover all pixels included in one linear region. The cathode electrode is typically formed by a sputtering method or a deposition method. Further, the cathode electrode need not always be separated by linear region. That is, when an anode electrode is controlled independently for every pixel electrode as in an active-matrix type, a TFT element that drives the pixel electrode is independent, and therefore the cathode electrode can be shared among a plurality of linear regions.

An organic EL display panel of the invention may be sealed by further providing a cover material to a surface on which the cathode electrode is formed. With the cover material, intrusion of moisture and oxygen is suppressed.

The organic EL display panel of the invention can be manufactured as described above, and can have structural features in a relationship between organic light-emitting layers formed in linear regions by coating and linear banks.

Figures 1, 12:
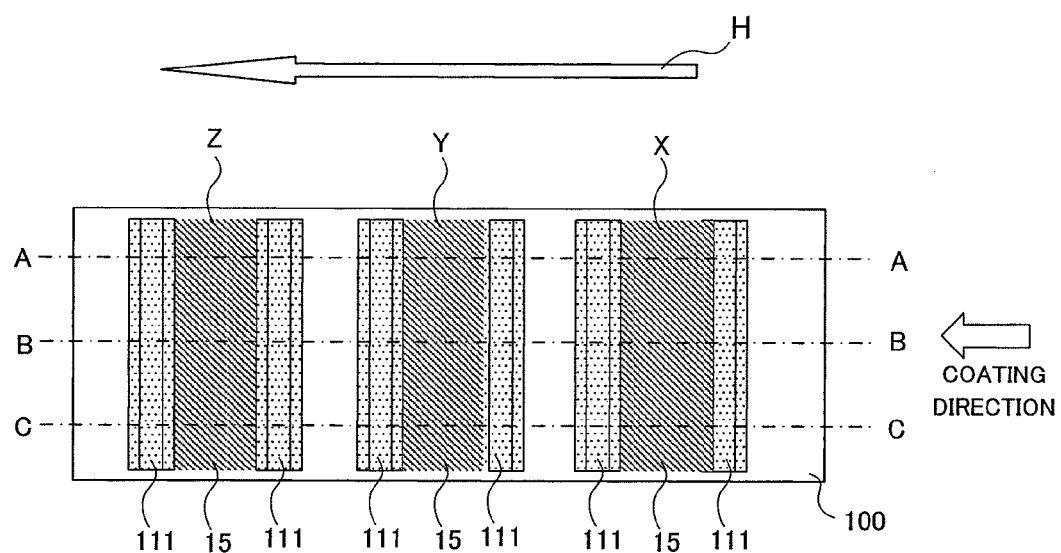
FIG. 12 shows cross-sections perpendicular to a line direction of organic light-emitting layers formed in linear regions defined by linear banks of an organic EL display of the invention.

A first feature of the organic EL display panel of the invention is that the heights of contacts between an organic light-emitting layer arranged in each linear region and linear banks are fixed in the line direction. As shown in FIG. 12, when attention is focused on one linear region (linear region X, Y or Z), the thickness of organic light-emitting layer 15 is fixed in the line direction. That is, regarding organic light-emitting layer 15 formed in each linear region (linear region X, Y or Z) in FIG. 12-1, a cross-section along the line A-A (FIG. 12-2), a cross-section along the line B-B (FIG. 12-3), and a cross-section along the line C-C (FIG. 12-4) are approximately identical to one another; the heights of contacts between organic light-emitting layer 15 and linear banks 111 are fixed in the line direction. The fixed height means that a difference between the minimum height and the maximum height is within 20% (preferably 10%) of the film thickness with a pixel of the organic light-emitting layer serving as the center. This is because according to a method of the invention, there is no large difference in the drying environment for a coating liquid in one linear region.

Figures 2, 12:
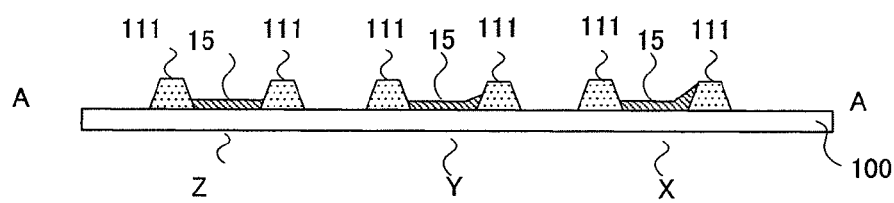
Figures 3, 12:
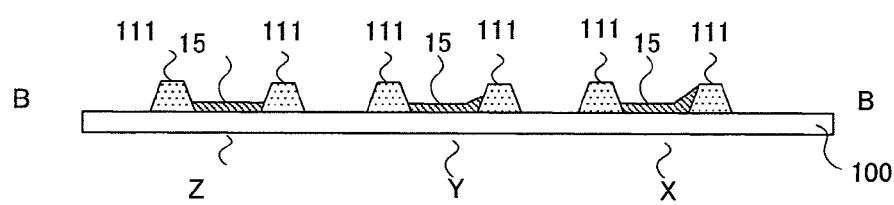
Figures 4, 12:
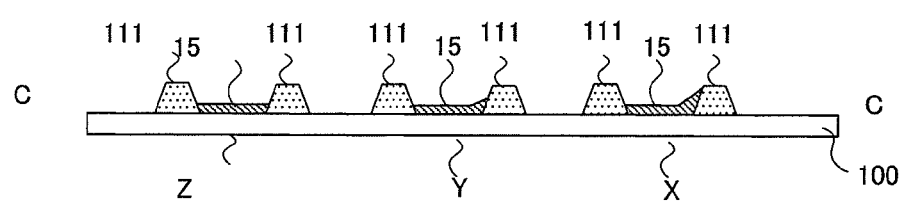
Figures 1, 13:
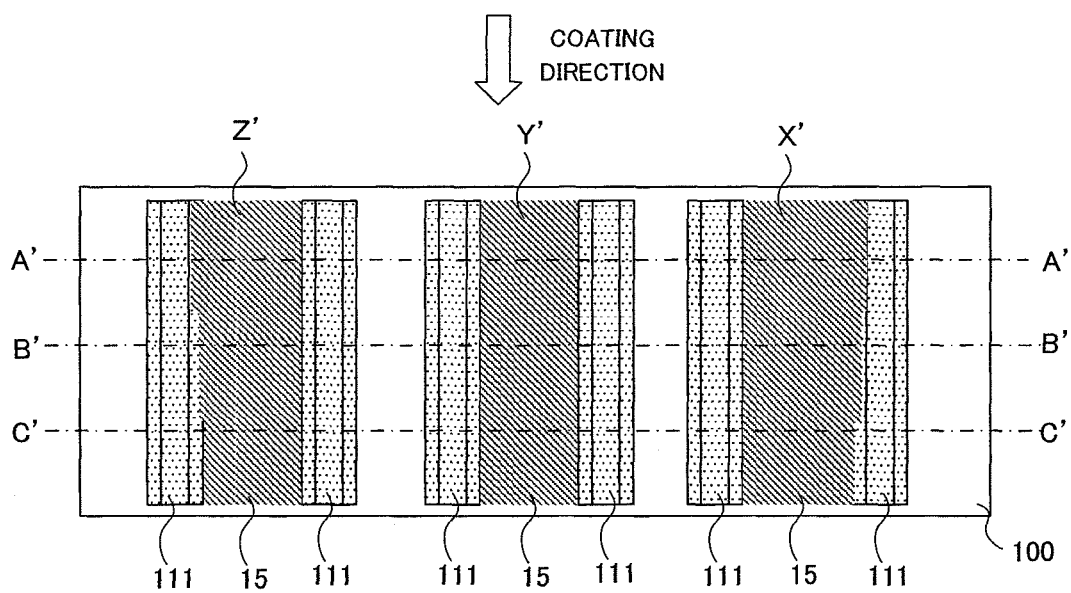
FIG. 13 shows cross-sections perpendicular to a line direction of organic light-emitting layers formed in linear regions defined by linear banks of a conventional organic EL display.
Figures 2, 13:
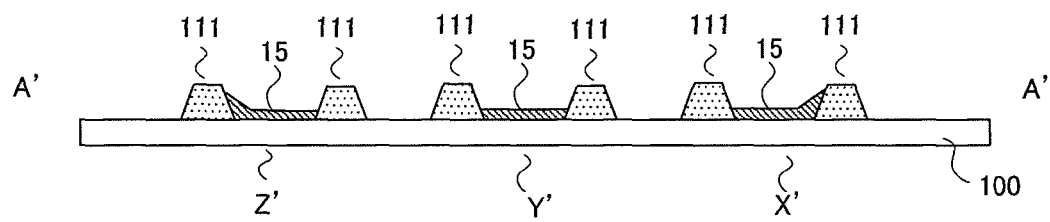
Figures 3, 13:
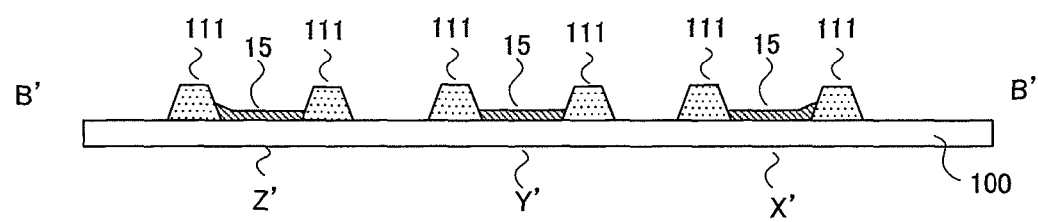
Figures 4, 13:
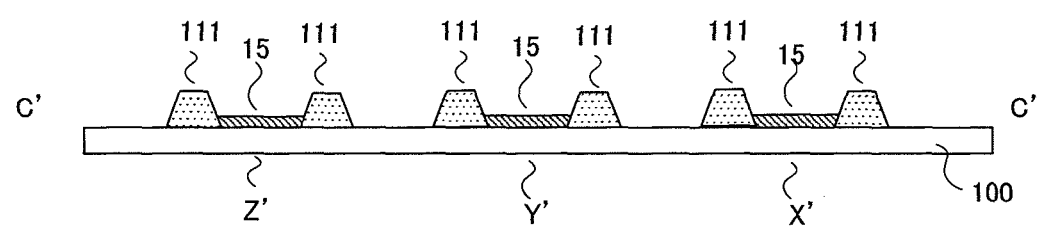

In contrast, in an organic light-emitting layer formed by providing a coating liquid along the line direction of linear banks, variations in the line direction easily occur among the heights of contacts between the organic light-emitting layer and linear banks in one linear region (see FIG. 13). That is, regarding an organic light-emitting layer formed in each linear region (X', Y' or Z') in FIG. 13-1, a cross-section along the line A'-A' (FIG. 13-2), a cross-section along the line B'-B' (FIG. 13-3), and a cross-section along the line C'-C' (FIG. 13-4) are not fixed, and variations are large. For example, when attention is focused on linear region X', a cross-section in A' is stranded on a side surface of bank 111 at the right side; a cross-section in C' is not stranded on a side surface of bank 111. In the case of providing a coating liquid along the line direction, there is a large difference in the drying environment of the coating liquid in one linear region, and therefore such variations occur.

The organic EL display panel having banks sometimes deteriorates gradually in its long-term use. It is considered that one of causes of the deterioration is that an outflow from the bank acts on the organic light-emitting layer. The outflow from the bank is, for example, moisture and an organic matter containing a hydroxyl group. The degree of deterioration of the organic light-emitting layer because of an outflow from the bank is considered to be affected by a positional relationship between the organic light-emitting layer and the bank.

The distance between pixels adjacent to each other in each linear region is very short. Therefore, when a difference occurs in the degree of deterioration of the pixels to cause a difference in light-emitting characteristic, the difference is visually recognized with ease as light emission unevenness of a display.

As mentioned above, in the organic EL display of the invention, the heights of contacts between the an organic light-emitting layer and linear banks can be fixed in every linear region. Therefore, the degree of progress of long-term deterioration can be the same among organic light-emitting devices included in one linear region. Accordingly, light emission unevenness of a display can be suppressed even in the long-term use.

Figure 1:
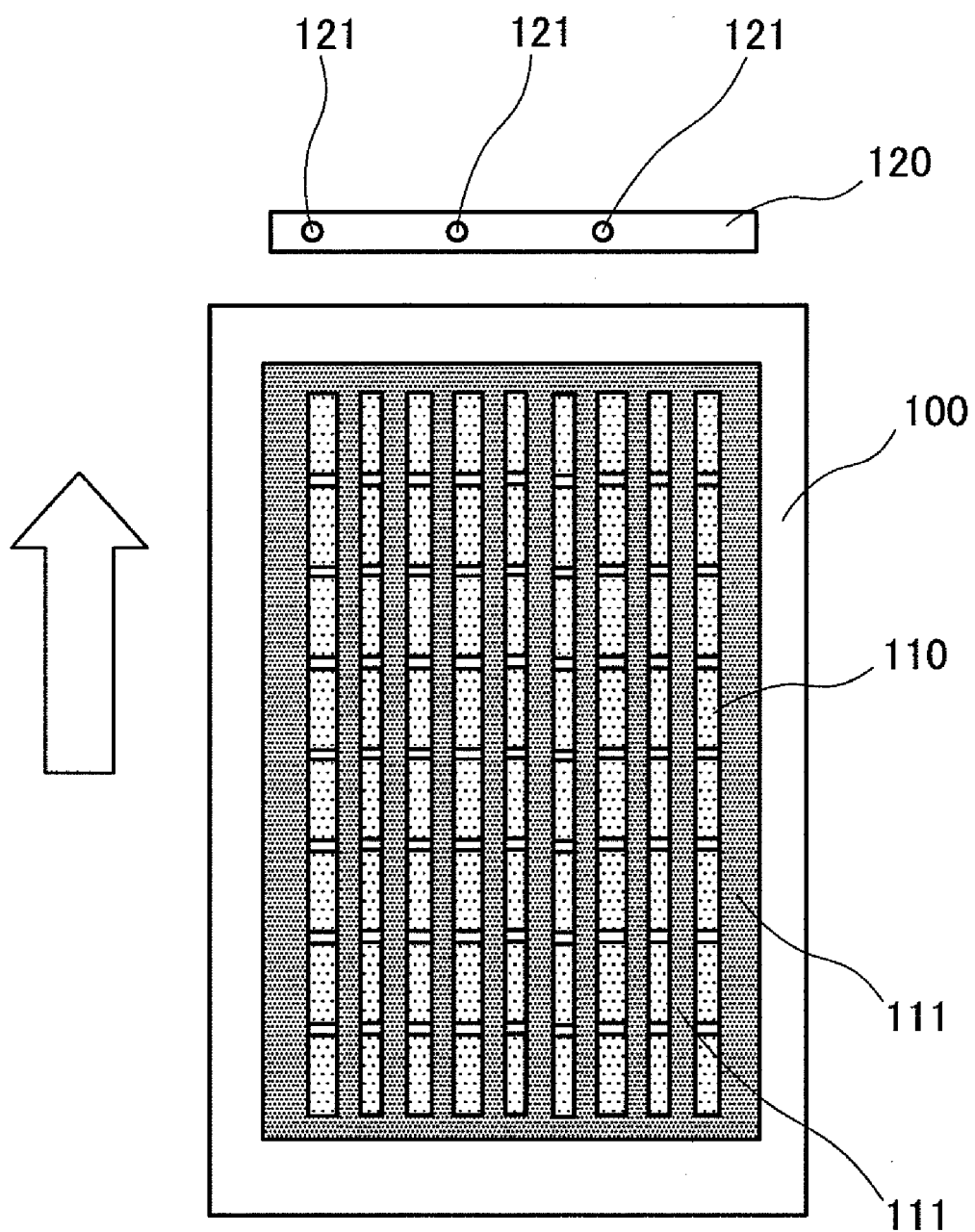
FIG. 1 shows a state in which an organic light-emitting layer is formed in a line shape by coating by a typical ink jet method.

A second feature of the organic EL display panel of the invention is as follows. The height of contact between an organic light-emitting layer formed in a linear region on one end of a display panel and linear bank are greater than the height of contact between an organic light-emitting layer formed in a linear region on the other end of the display panel and linear banks. As shown in FIG. 12-1, since the drying speed of a coating liquid applied to linear region X in an end on a side (right side) where coating of substrate 100 starts is rapid, organic light-emitting layer 15 formed by drying is likely to be stranded on a side surface of bank 111 (see FIGS. 12-2 to 12-4). On the other hand, since the drying speed of a coating liquid applied to linear region Z in an end on a side (left side) opposite to the side where coating of substrate 100 starts is slow, formed organic light-emitting layer 15 is unlikely to be stranded on a side surface of bank 111.

As a matter of course, the film thickness profile of an organic light-emitting layer in each pixel affects the light-emitting characteristic. Moreover, even with a difference of the film thickness profile that is not visually recognized as the light-emitting characteristic, the heat generation characteristic may be varied. Specifically, since organic light-emitting layer 15 formed in linear region X arranged in one end (on a side where coating starts) of a display panel in FIG. 12-1 tends to have a large film thickness distribution, the amount of heat generation of an organic light-emitting device in linear region X is relatively large. On the other hand, since organic light-emitting layer 15 formed in linear region Z arranged in the other end of the display panel has a suppressed film thickness distribution, the amount of heat generation of organic light-emitting device 15 in linear region Z is relatively small.

Thus, when the organic EL display of the invention is driven, heat is easily generated from one end to produce a flow of heat therefrom (see arrow H). If such a flow of heat does not exist, a temperature distribution in the form of a concentric circle around the vicinity of the center of the panel occurs. The use in a long period is likely to cause light emission unevenness corresponding to this temperature distribution. The light emission unevenness in the form of a concentric circle around the vicinity of the center of the panel is easy to visually recognize. When a flow of heat occurs as in the display of the invention, the temperature distribution is not in the form of a concentric circle around the center of the panel. In this case, even if light emission unevenness occurs, it is difficult to visually recognize the unevenness.

One of the sealing structure of the organic EL display is a structure referred to as a "can sealing structure." The can sealing structure is a structure that puts a sealing can on a display substrate on which an organic light-emitting device is formed, so that the organic light-emitting device is protected from the external environment. In the can sealing structure, heat tends to stay inside the sealing can. When a flow of heat is produced inside the sealing can, a heat distribution is made uniform by convection. Further, moisture and oxygen gas present in the interior of the sealing can move by the flow of heat. When an adsorbent that absorbs moisture and oxygen gas is arranged at a downstream position, moisture and oxygen gas can be removed with efficiency.

Figure 4:
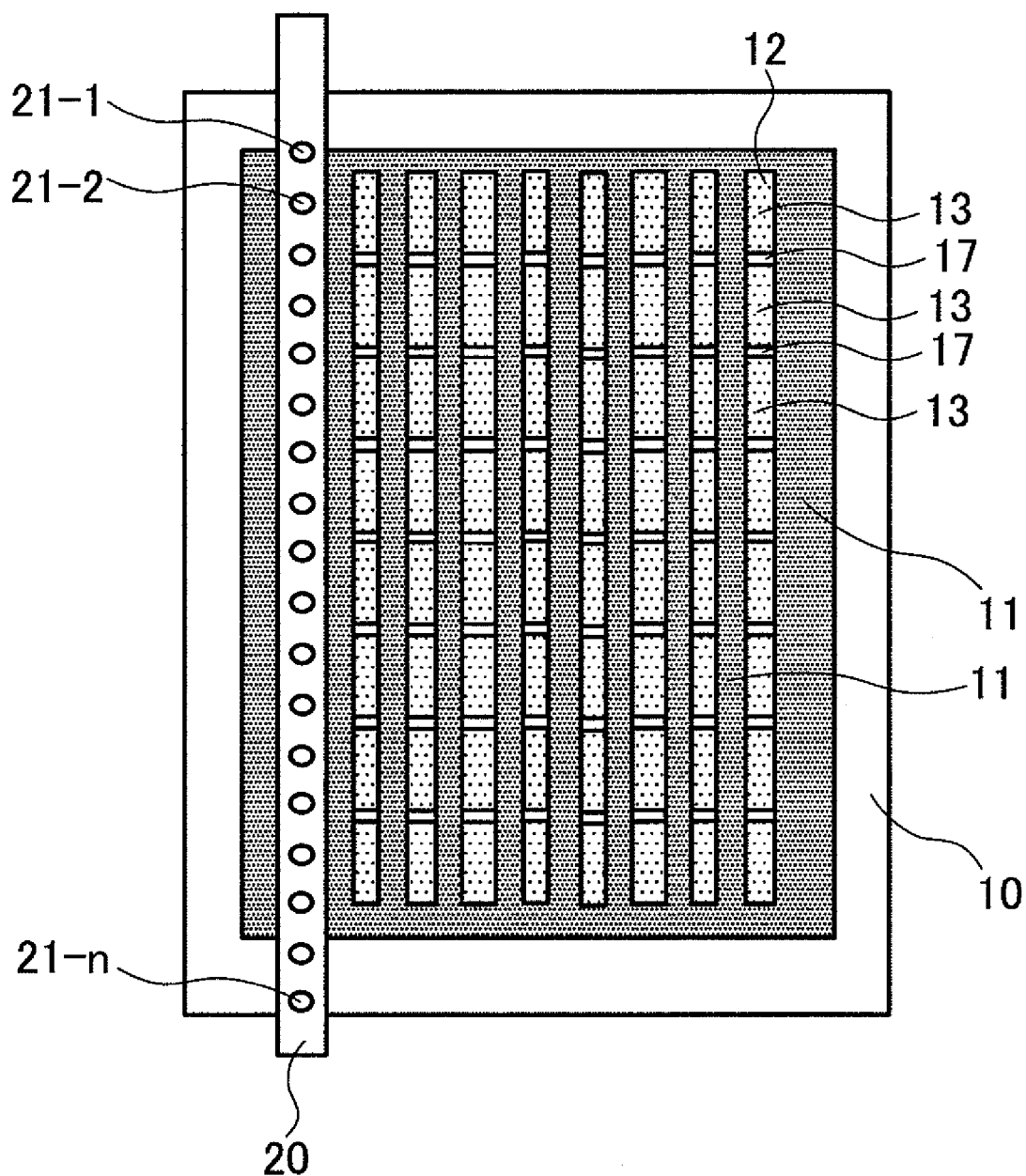
FIG. 4 shows a state of forming an organic light-emitting layer in a line shape by coating with an ink jet method of the invention.
Figures 1, 14:
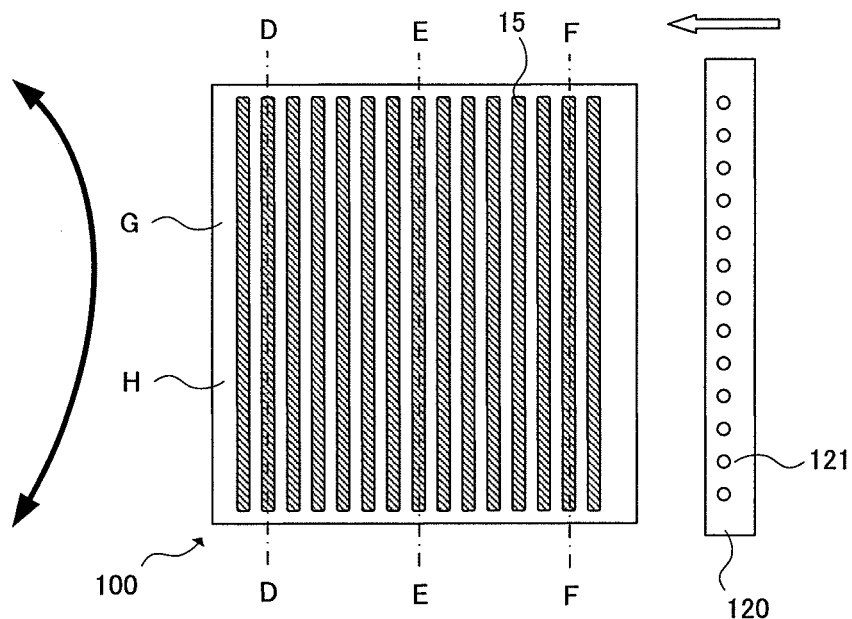
FIG. 14 shows cross-sections in parallel to a line direction of organic light-emitting layers formed in linear regions defined by linear banks of an organic EL display of the invention.
Figures 2, 3, 4, 14:
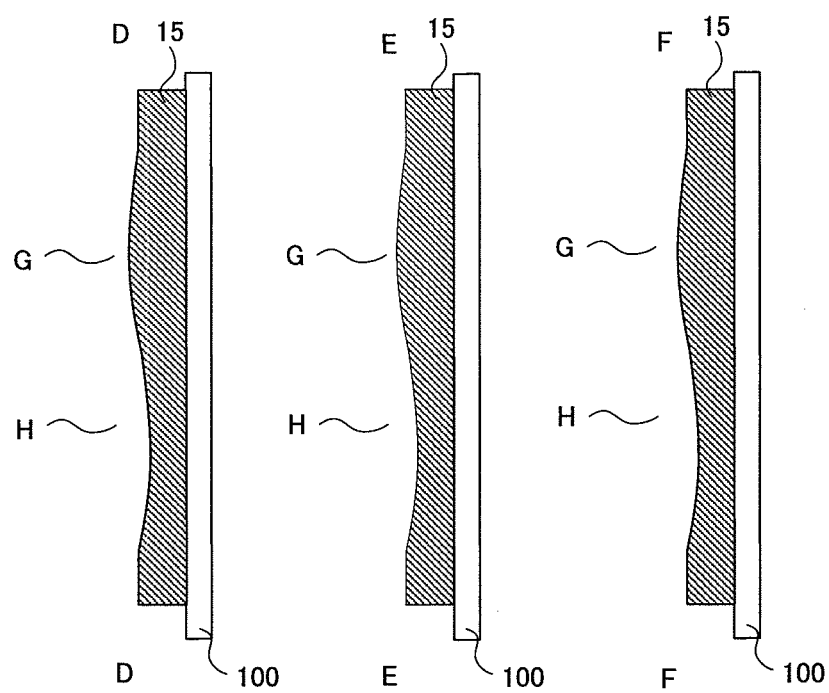

A third feature of the organic EL display of the invention is that film thickness profiles in the line direction of organic light-emitting layers formed in linear regions are similar to one another. That is, as shown in FIG. 14-1, any one of organic light-emitting layers 15 formed in linear regions is relatively thick at one position (G) in the line direction; it is relatively thin at another position (H) in the line direction (see FIGS. 14-2 to 14-4). FIG. 14-2 is a cross-sectional view taken along the line D-D of FIG. 14-1; FIG. 14-3 is a cross-sectional view taken along the line E-E of FIG. 14-1; FIG. 14-4 is a cross-sectional view taken along the line F-F of FIG. 14-1.

As described above, nozzles of an ink jet head vary in size, and their sizes are not necessarily constant. According to a coating method of the invention, droplets simultaneously fall over the whole one linear region, and the thickness of the coated film is made uniform (leveled). Therefore, the thickness of an organic light-emitting layer is made uniform over the whole linear region. However, variations in the sizes of nozzles, variations in the temperatures of nozzles and variations in the drying states of nozzles, which have no influence on light-emitting characteristic, are reflected in the thickness of an organic light-emitting layer to cause a distribution of the thickness.

Even if the organic light-emitting layer of the organic EL display of the invention has a distribution in thickness, thickness distributions in the line direction of organic light-emitting layers of any linear regions are similar (see FIGS. 14-2 to 14-4). That is, positions in the line direction of the thickest portions or the thinnest portions of organic light-emitting layers in linear regions are exactly aligned or vary within a distance 2 to 8 times as long as the nozzle pitch. Therefore, even if a stress is applied to a display such that the display is curved in the line direction (bent around an axis perpendicular to the line direction), deformations in the thickness direction in all linear regions are the same. This suppresses damage to organic light-emitting layers.

Figures 1, 15:
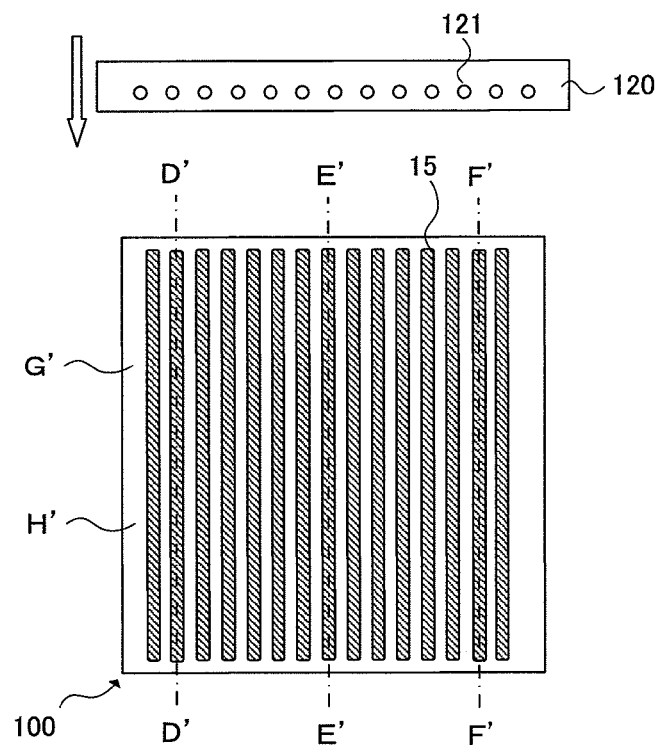
FIG. 15 shows cross-sections in parallel to a line direction of organic light-emitting layers formed in linear regions defined by linear banks of a conventional organic EL display.
Figures 2, 3, 4, 15:
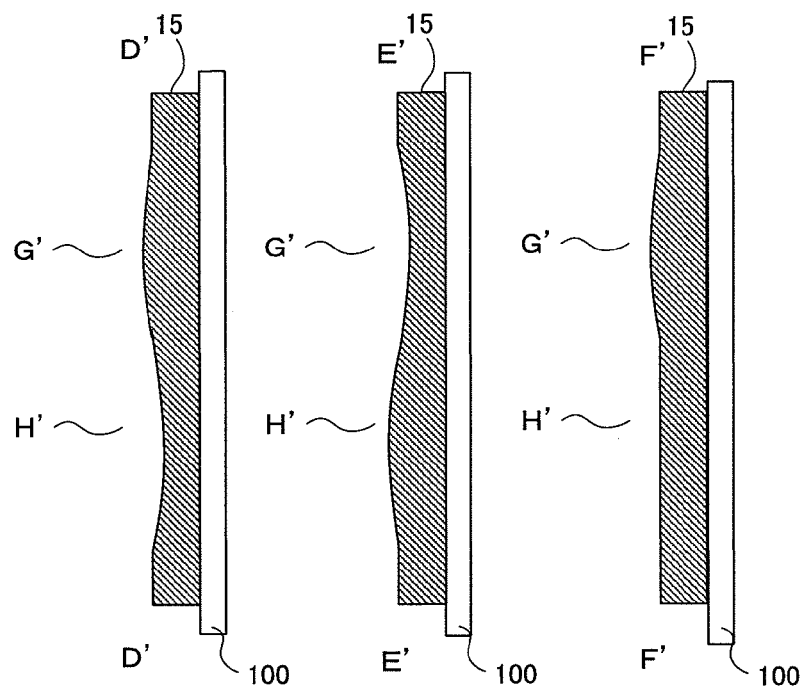

On the other hand, as shown in FIG. 15-1, in organic light-emitting layers 15 formed by providing a coating liquid along the line direction of linear banks, their film thickness profiles in the line direction differ from one linear region to another and are not similar (FIG. 15-2 to 15-4). That is, FIG. 15-2 is a cross-sectional view taken along the line D'-D' of FIG. 15-1; FIG. 15-3 is a cross-sectional view taken along the line E'-E' of FIG. 15-1; FIG. 15-4 is a cross-sectional view (FIG. 15-4) taken along the line F'-F' of FIG. 15-1. The film thickness profiles of any organic light-emitting layers 15 differ from one another. In such a case, when a stress is applied to a display such that the display is curved in the line direction (bent around an axis perpendicular to the line direction), deformations in the thickness direction greatly differ from one adjacent linear region to another. This adds damage to organic light-emitting layers.

The organic EL display panel can be made as a flexible display (e.g., a roll display or a folding display). As a usage of a flexible display, for example, it is conceivable to bend the display in parallel with the extending direction of linear banks. If the thickness profile of an organic light-emitting layer in one linear region distinctly differs from the thickness profile of an organic light-emitting layer in another linear region, the organic light-emitting layer in the one linear region is likely to be broken upon bending the display in parallel with the extending direction of linear banks. In a method of coating along the line direction of linear banks, an organic light-emitting layer having a distinctly different thickness profile is sometimes formed because of variations in ink jet nozzles. In this case, the whole organic light-emitting layer is broken. As a result, the quality as a display cannot be ensured. In the organic EL display of the invention, even if there are variations in the nozzles of an ink jet head, a coating liquid applied into a linear region is made even. This makes it difficult to form an organic light-emitting layer having a distinctly different thickness profile. As mentioned above, in the organic EL display of the invention, thickness profiles in the line direction of organic light-emitting layers in linear regions are similar. Therefore, even if each of the organic light-emitting layers has portion having a distinct thickness can be formed, the portions are aligned along the line perpendicular to the line direction. Therefore, the organic light-emitting layer is unlikely to be broken with bending the display in parallel with the extending direction of linear banks.

Figure 16:
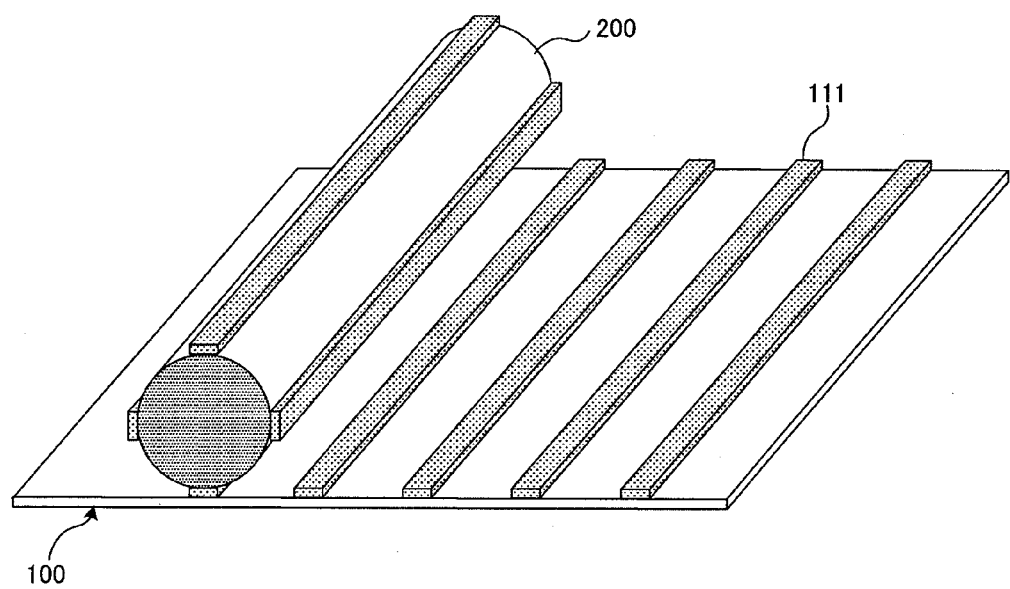
FIG. 16 schematically shows a state of manufacturing linear banks by a printing method.

Linear banks of the organic EL display of the invention may be formed by a photolithography method, and may also be formed by a printing method. Examples of the printing method include a gravure offset printing method. As shown in FIG. 16, according to a printing method, a bank material (e.g., a resin material) placed on the surface of printing cylinder 200, so-called cylinder, is transferred onto substrate 100 to form linear banks 111. The shapes of linear banks 111 formed by the printing method are precisely the same in the line direction. That is, variations in shape in the line direction are the same for any linear banks 111.

When by a method of the invention ink is applied in each linear region of linear banks formed by a printing method, through leveling of the coating liquid the shape profile of the organic light-emitting layer is hard to be reflected by the variations in shape in the linear bank. On the other hand, if an organic light-emitting layer is formed by supplying a coating liquid along the line direction of linear banks to each linear region defined by linear banks formed by a printing method, not only the shape profile of the organic light-emitting layer is likely to be reflected by the variations in shape in the linear bank, but also the variations of nozzles of an ink jet head and the shape variations in the line direction of linear banks might be combined together.

The organic EL display panel of the invention is sometimes provided with a color filter for every pixel in order to increase color purity. The color filter is made of a colored layer arranged between linear banks adjacent to each other. In the case of forming a colored layer of this color filter by an ink jet method, variations of nozzles of an ink jet head sometimes cause unevenness in the color filter. To address this, when an organic light-emitting layer is formed by coating liquid along the direction perpendicular to the line direction of linear banks as in the invention, it is preferable that a color filter be formed by coating liquid along the line direction of linear banks. This is for the purpose of suppressing combining of mutual variations. For the sake of cost reduction, a colored layer of the color filter is sometimes applied along linear regions in succession by a dispenser or the like. In this case, it is preferable that an organic light-emitting layer be formed by coating in a direction perpendicular to the linear banks so that mutual variations are not combined together.

The cathode electrode of the organic EL display of the invention is sometimes deposited by sputtering. For example, in the case of a top emission type organic EL display, ITO, which is a transparent electrode, is sometimes deposited as a cathode electrode by sputtering. Sputtering deposition can be performed, for example, using a magnetron sputtering device, which transports a member on which a cathode electrode is to be deposited (a display substrate on which an organic light-emitting device with no cathode electrode) to cause it to pass through a sputter region. Since the environment of the sputter region is not necessarily uniform (with variations), slight streaks can occur along the transport direction in a film formed by sputtering.

Figure 17:
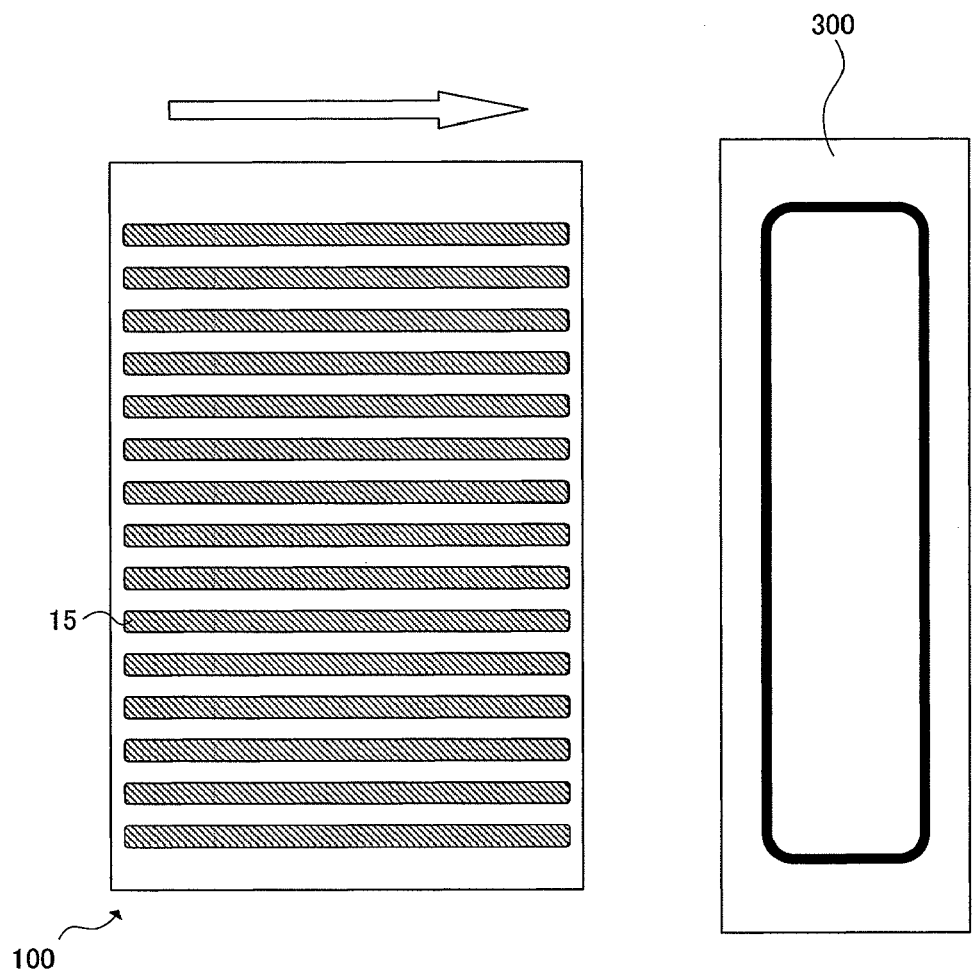
FIG. 17 shows a state when depositing a cathode electrode by sputtering.

In the case where an organic light-emitting layer is formed by coating liquid along the direction perpendicular to the line direction of linear banks as in the invention, as shown in FIG. 17, when a cathode electrode is deposited by sputtering, it is preferable that substrate 100 be transported along the line direction of linear banks (i.e., the longitudinal direction of organic light-emitting layer 15) to pass through sputter region 300. This is for the purpose of suppressing combining of variations of nozzles of an ink jet head and variations in the sputter region together.

In the case of an active-matrix organic EL display, cathode electrodes of all organic light-emitting pixels can be made conductive. When the substrate is transported along the line direction of linear banks to pass through a sputter region, the coverage is increased to suppress thinning or cutting of the deposited cathode on the bank. Therefore, conductivity of the cathode electrode can be improved.

Further, the organic EL display of the invention can have a sealing resin layer that seals an organic light-emitting device formed on a substrate. To seal the organic light-emitting device with resin layer, for example, sealing resin can be applied to a display substrate on which an organic light-emitting device is arranged; and placing a sealing substrate (glass substrate) on the display substrate, a gap between the display substrate and the sealing substrate is filled with sealing resin. When the display substrate and the sealing substrate are brought into close contact to each other, the sealing resin spreads in the gap along the line direction of linear banks. Since the sealing resin spreads along the line direction, streaks in the line direction sometimes occur in the formed sealing resin layer.

As mentioned above, the organic light-emitting layer of the organic EL display of the invention is formed by coating liquid along the direction perpendicular to the line direction of linear banks, and therefore streaks in the line direction are unlikely to occur. Therefore, light emission unevenness due to streaks in the foregoing sealing resin can be suppressed. In contrast, in the organic light-emitting layer formed by providing a coating liquid along the line direction of linear banks, streaks in the line direction are likely to occur. Therefore, there is a potential of emphasizing light emission unevenness in combination with streaks of the foregoing sealing resin.

INDUSTRIAL APPLICABILITY

With a manufacturing method of the invention, a high definition organic EL display without streaks is provided.

This application claims the benefit of priority based on Japanese Patent Application No. 2008-141291, filed on May 29, 2008. The disclosure of the application including the specification and drawings of the application is incorporated herein by reference in its entirety.

DESCRIPTION OF REFERENCE NUMERALS 100 substrate
110 linear region
111 linear bank
120 ink jet head
121 nozzle
10 substrate
11 linear bank
12 linear region
13 pixel region
14 ink droplet
15, 15R, 15G, 15B organic light-emitting layer
16 applied film
17 gap
20 ink jet head
21 nozzle
200 printing cylinder
300 sputter region

The invention claimed is:

1. A method of manufacturing an organic EL display, comprising:
providing a display substrate having a substrate, at least two linear banks arranged on the substrate in parallel, at least two pixel regions arranged in linear regions defined by the at least two linear banks, and a gap between the at least two pixel regions, a height of the gap being greater than heights of the at least two pixel regions;
arranging a plurality of ink jet heads adjacent to one another at an edge of the substrate, the edge being parallel to a line direction of the at least two linear banks, the plurality of ink jet heads each including at least two nozzles aligned in a row at a predetermined pitch, ink containing an organic light-emitting material supplied to the at least two nozzles, the row of the at least two nozzles of each of the plurality of ink jet heads being inclined with respect to the line direction, at least one of the at least two nozzles of a first ink jet head of the plurality of ink jet heads overlapping with at least one of the at least two nozzles of a second ink jet head of the plurality of ink jet heads when viewed in a moving direction of the plurality of ink jet heads, the first ink jet head and the second ink jet head being adjacent to one another; and
moving the plurality of ink jet heads relative to the display substrate in a direction perpendicular to the line direction of the at least two linear banks and discharging the ink from the at least two nozzles to apply the ink to each of the linear regions to form a linear applied film that covers the gap and the at least two pixel regions arranged in each of the linear regions.

2. The manufacturing method according to claim 1, further comprising waiting until the ink applied to the linear regions defined by the at least two linear banks becomes uniform, and then drying a solvent contained in the ink.

3. The manufacturing method according to claim 1, wherein a distance from a first nozzle at one end to a second nozzle at another end, among the at least two nozzles arranged in one of the plurality of ink jet heads, is at least equal to a length of the linear regions of the substrate in the line direction.

4. The manufacturing method according to claim 1, wherein
a speed of moving the plurality of ink jet heads relative to the display substrate in the direction perpendicular to the line direction of the at least two linear banks is variable; and
the speed of moving the plurality of ink jet heads relative to the display substrate while the ink is discharged from the at least two nozzles to the linear regions defined by the at least two linear banks is less than the speed of moving the plurality of ink jet heads relative to the display substrate while the ink is not discharged.

5. The manufacturing method according to claim 1, wherein the ink discharged from the at least two nozzles lands on a forward side in the linear regions defined by the at least two linear banks, with respect to a moving direction of the display substrate relative to the plurality of ink jet heads, the ink landing on the forward side and spreading toward a rear side of the display substrate relative to the moving direction.

6. The manufacturing method according to claim 1, wherein:
   as to a pair of the at least two linear banks that defines one of the linear regions, a wettability of a linear region side of one linear bank of the pair is less than a wettability of a linear region side of an other linear bank of the pair,
   the one linear bank being forward with respect to a moving direction of the display substrate relative to the plurality of ink jet heads, the other linear bank being rear with respect to the moving direction of the display substrate relative to the plurality of ink jet heads.

7. An organic EL display, comprising:
   a substrate;
   a plurality of linear banks arranged on the substrate in parallel;
   at least two pixel regions arranged in a linear region defined by the plurality of linear banks;
   a gap between the at least two pixel regions; and
   a linear organic light-emitting layer arranged in the linear region including the at least two pixel regions and the gap, the organic light-emitting layer covering the gap and the at least two pixel regions,
   wherein a height of the gap is greater than heights of the at least two pixel regions, and
   contacts between the linear organic light-emitting layer and the plurality of linear banks have a fixed height in a line direction.

8. The organic EL display according to claim 7, wherein:
   the substrate includes at least a first linear region and a second linear region, the first linear region provided at one end of the substrate, the second linear region provided at an opposite end of the substrate, wherein
   a height of a contact between the linear organic light-emitting layer arranged in the first linear region and one of the plurality of linear banks at the one end of the substrate is less than a height of a contact between the linear organic light-emitting layer arranged in the second linear region and one of the plurality of linear banks at the opposite end side of the substrate.

* * * * *